(12) United States Patent
Iacob et al.

(10) Patent No.: US 7,042,380 B2
(45) Date of Patent: May 9, 2006

(54) DIGITAL POTENTIOMETER WITH RESISTOR BINARY WEIGHTING DECODING

(75) Inventors: Radu H. Iacob, Santa Clara, CA (US); Sorin S. Georgescu, San Jose, CA (US); Charles Frank Wojslaw, deceased, late of Auburn, CA (US); by Toni M. Wojslaw, legal representative, Auburn, CA (US)

(73) Assignee: Catalyst Semiconductor, Inc., Sunnyvale, CA (US)

(*) Notice: Subject to any disclaimer, the term of this patent is extended or adjusted under 35 U.S.C. 154(b) by 154 days.

(21) Appl. No.: 10/860,476

(22) Filed: Jun. 2, 2004

(65) Prior Publication Data

US 2005/0270043 A1 Dec. 8, 2005

(51) Int. Cl.
*H03M 1/78* (2006.01)
(52) U.S. Cl. .......................... 341/154; 341/144
(58) Field of Classification Search ................ 341/154
See application file for complete search history.

(56) References Cited

U.S. PATENT DOCUMENTS

| | | | |
|---|---|---|---|
| 4,271,486 A | 6/1981 | Dagostino et al. | |
| 4,468,607 A | 8/1984 | Tanaka et al. | |
| 4,668,932 A | 5/1987 | Drori et al. | |
| 5,084,667 A | 1/1992 | Drori et al. | |
| 5,243,535 A | 9/1993 | Bolan et al. | |
| 5,297,056 A | 3/1994 | Lee et al. | |
| 5,495,245 A | 2/1996 | Ashe | |
| 5,526,274 A | 6/1996 | Bolan et al. | |
| 5,717,323 A | 2/1998 | Tailliet | |
| 5,717,935 A | 2/1998 | Zanders et al. | |
| 5,913,181 A | 6/1999 | Ezell | |
| 6,201,491 B1 | 3/2001 | Brunolli et al. | |
| 6,320,451 B1 | 11/2001 | Harvey et al. | |
| 6,331,768 B1 | 12/2001 | Drori et al. | |
| 6,552,519 B1* | 4/2003 | Nazarian ..................... | 323/354 |
| 6,882,136 B1* | 4/2005 | Nazarian et al. ............ | 323/354 |
| 2003/0155902 A1 | 8/2003 | Stanescu et al. | |

OTHER PUBLICATIONS

Catalyst Semiconductor, Inc., "CAT515: 8-Bit Quad DACpot with RDY/BUSY and IND. Reference Inputs," 1997, pp. 1-11.
Catalyst Semiconductor, Inc., "CAT524: 8-Bit Quad Digital POT," 1998, pp. 25-36.

(Continued)

*Primary Examiner*—Rexford Barnie
*Assistant Examiner*—Joseph Lauture
(74) *Attorney, Agent, or Firm*—Bever, Hoffman & Harms, LLP; E. Eric Hoffman

(57) ABSTRACT

A digital potentiometer includes a string of impedance units in series. The string includes identical first and second sets of impedance units whose individual impedance values increment by a power of two. One of a plurality of switches is coupled in parallel with each respective impedance unit. The switches that are coupled to the first set of impedance units receive logical control signals complementary to logical control signals received by the respective switches coupled to the second set of impedance units, so that for every impedance unit of the first set that is bypassed (not bypassed), the identical impedance unit of the second set is not bypassed (bypassed). The string may include only the first and second sets of impedance units, or may include at least one third impedance unit in series with the first and second sets in a multi-stage design.

43 Claims, 7 Drawing Sheets

OTHER PUBLICATIONS

Catalyst Semiconductor, Inc., "CAT514: 8-Bit Quad DACpot," 1997, pp. 1-13.

Catalyst Semiconductor, Inc., "CAT514: 8-Bit Quad Digital POT," 1999, pp. 1-12.

Catalyst Semiconductor, Inc., "CAT525: 8-Bit Quad Digital POT With Independent Reference Inputs," 1999, pp. 1-11.

Catalyst Semiconductor, Inc., "CAT5111, CAT5112, CAT5113 and CAT5114: 100/32-Tap Digital POT with Independent Reference Inputs," 1999, pp. 1-6.

Stanescu et al., "32 Taps Digitally Controlled Buffered Potentiometer," Proceedings of CAS 2001 International Semiconductor Conference, IEEE Catalog No. 01TH8547, pp. 535-538, Oct. 2001.

* cited by examiner

DIGITAL POTENTIOMETER WITH RESISTOR BINARY WEIGHTING DECODING

BACKGROUND a. Technical Field

The present invention is in the field of digital potentiometers.

b. Discussion of the Related Art

Digital potentiometers are electronic circuits that can provide a variable impedance as a result of processing a digital sequence. A digital potentiometer has a fixed-value impedance connected between two reference voltage terminals. This impedance is provided by a string of impedance units that can be selectively connected to a third terminal, called the wiper terminal herein, through electronic switches controlled by digital signals. Digital potentiometers can be used in digital to analog converters, and as replacements for mechanical potentiometers and rheostats.

The fineness of adjustment, resolution, or "granularity" of a digital potentiometer is typically determined by the number of digital bits used for the selection of the desired wiper position. For instance, a three-bit wiper address (n=3) allows for $2^3$ (i.e., 8) different wiper impedance selections, i.e., wiper positions.

FIG. 1 is a schematic diagram of a digital potentiometer 100 that operates on the voltage-scaling principle. A string 101 of $2^n-1$ resistors $R_0, R_1, \ldots R_{2^n-2}$ is connected between a high reference voltage ($V_{REF+}$) terminal 102 and a low reference voltage ($V_{REF-}$) terminal 104. The voltage drop across each one of the resistors is equal to one least significant bit (LSB) of output voltage $V_w$ change. The output analog voltage signal $V_w$ is collected on wiper terminal 106.

The wiper position is set by a switch decoding network, illustrated by decoder 108 and $2^n$ wiper switches $S_0, S_1, \ldots S_{2^n-1}$. The decoder 108 receives an n-bit wiper address on line 110, decodes the n-bit wiper address, and outputs $2^n$ one-bit logical control signals $C_0, C_1, \ldots C_{2^n-1}$ on lines 112(0)–112($2^n$–1). A respective one of the control signals is provided to each respective one of the $2^n$ wiper switches $S_0, S_1, \ldots S_{2^n-1}$. Each of the $2^n$ wiper switches $S_0, S_1, \ldots S_{2^n-1}$ taps a different node in the resistor string 101. The state of the particular control signal $C_0$–$C_{2^n-1}$ received by the respective wiper switch $S_0$–$S_{2^n-1}$ determines whether the wiper switch will be open (i.e., nonconducting) or closed (i.e., conducting). Closing a selected one of wiper switches while leaving all of the other wiper switches open provides a unique ratio between the resistance values of the two resistor sub-chains connected to wiper terminal 106 via the closed wiper switch.

One disadvantage of this configuration is the relatively large number of components necessary to implement the digital potentiometer, including the $2^n$–1 resistors of string 101, the $2^n$ wiper switches, and the many components of logic decoder 108. For example, in a four bit (n=4) implementation, the digital potentiometer 100 requires 15 resistors, 16 wiper switches, and a decoder 108 large enough to control the 16 wiper switches. In an eight-bit (n=8) implementation, the digital potentiometer 100 requires 255 resistors, 256 wiper switches, and a decoder 108 large enough to control the 256 wiper switches.

In general, it is desirable to reduce the number of components in a digital potentiometer for purposes of die-area savings, higher manufacturing yields, lower costs, and improved electrical performance.

SUMMARY

The present invention includes digital potentiometers that may be implemented using significantly fewer components than are used in the conventional digital potentiometer 100 of FIG. 1, while providing the same resolution, i.e., same number of wiper positions.

One exemplary embodiment, shown in FIG. 2, is a single-stage n-bit digital potentiometer that includes a string of 2n impedance units coupled in series between first and second terminals. A central node bisects the string into identical first and second sets of n impedance units in series. The output voltage, i.e., the wiper voltage, is collected at the central node. The n impedance units of each of the first and second sets of impedance units increment in impedance value according to the formula $I_0 * 2^X$, where $I_0$ is a selected base impedance value and X is a series of integers between and inclusive of zero through (n–1). Hence, each impedance unit of the first set of impedance units has a different impedance value than each of the other impedance units of the first set of impedance units, and is equal in impedance to one (and only one) impedance unit in the second set of impedance units, and vice versa. The first and second sets of impedance units may be mirror images of each other with respect to the central node.

The digital potentiometer further includes 2n switches. Each switch is coupled in parallel with a respective one of the 2n impedance units of the string, and operates to bypass and not bypass the respective impedance unit with which the switch is coupled in parallel. The switches coupled to the first set of impedance units are each actuated by a respective one of the n bits of an input wiper address, and the switches coupled to the second set of impedance units are actuated by complementary bits. Accordingly, for every impedance unit of the first set of impedance units that is bypassed (or is not bypassed) in response to one of the bits of an input n-bit wiper address, the identical impedance unit of the second set of impedance units is not bypassed (or is bypassed) in response to a complementary bit. Accordingly, a unique output voltage corresponding to the n-bit wiper address is provided at the central node, i.e., the wiper terminal, because the complementary switching of the switches to bypass and not bypass identical impedance units of the first and second sets of impedance units maintains a constant impedance between the first and second terminals. Since the n-bit wiper address may be applied directly and naturally to actuate the switches of the digital potentiometer, there is no need to have a decoder circuit like that of the conventional digital potentiometer of FIG. 1. Moreover, fewer impedance units and switches are required to achieve the same number of wiper positions as are provided by the conventional digital potentiometer of FIG. 1.

A second exemplary embodiment, shown in FIG. 4, is a two-stage n-bit digital potentiometer that includes a string of impedance units coupled in series between first and second terminals. With respect to the first stage, the string includes identical first and second sets of m impedance units in series, where m is a variable, and $n \geq 3 > m \geq 2$. The impedance values of the m impedance units of each of the first and second sets of impedance units increment in impedance value according to the formula $I_0 * 2^X$, where $I_0$ is a selected impedance value and X is a series of integers between and inclusive of zero through (m–1). With respect to the second stage, the string further includes a third set of $2^p$–1 identical impedance units in series with each other and the first and second sets of impedance units, wherein $p=(n-m) \geq 1$. Each impedance unit of the third set of impedance units has an impedance value of $I_0/(2^p-1)$. The third set of impedance units may be coupled between the first and second impedance units, and the first and second set of impedance units may be mirror images of each other with respect to the third set of impedance units.

A plurality of switches, in particular $2m+2^p$ switches, are coupled to the string. One of 2m switches is coupled in parallel with each respective one of the m impedance units of the first and second sets of impedance units, with each switch being operable to bypass and not bypass the respective impedance unit with which it is coupled in parallel. The m switches coupled to the impedance units of the first set are each coupled to receive a respective one of m logical controls signals that correspond to the m most significant bits of the n bit wiper address, and the m switches coupled to the impedance units of the second set of impedance units are each coupled to receive a respective one of m complementary logical control signals. The remaining $2^p$ switches are each disposed to tap the string at a unique node of the second stage of the string. In particular, each of the $2^p$ switches has a first terminal and a second terminal. The first terminal of each of the $2^p$ switches is coupled to an end of one or two of the impedance units of the third set of impedance units, so that each node of the third set of impedance units, including the two end nodes and any internal nodes of the third set of impedance units, is coupled to the first terminal of a respective one of the $2^p$ switches. A second terminal of each of the $2^p$ switches is coupled to a common node where the output voltage, i.e., the wiper voltage, is collected. The $2^p$ switches each receive a respective one of plural logical control signals that are decoded from the p least significant bits of the n bit wiper address. The logical control signals received by the $2^p$ switches allow for only one of the $2^p$ switches to be closed in response to any given n-bit wiper address. Accordingly, the closing of a selected one of the $2^p$ switches coupled to the third set of impedance units, in combination with the opening and closing, in complementary fashion, of the 2m switches coupled to the first and second sets of impedance units, taps the string at one node of the string provides a unique ratio between the impedance values of the two impedance sub-chains connected to the wiper terminal via the closed one of the $2^p$ switches.

Accordingly, the second embodiment also requires fewer impedance units and switches to achieve the same number of wiper positions as the conventional digital potentiometer of FIG. 1. In addition, while a decoder or the like is used to control the switching of the switches coupled to the third set of impedance devices, the decoding function is simpler than in the conventional digital potentiometer of FIG. 1, since less than all of the n bits of the n-bit wiper address are decoded.

A third embodiment, exemplified by FIG. 5, is similar to the second embodiment, except that the impedance values of the impedance units of the second stage of the string are different, and the control signals received by the first and second stages are reversed. In particular, each of the $2^p-1$ identical impedance units of the third set of the string has an impedance value of $I_0*2^m$. In addition, the m switches coupled to the m impedance units of the first set are each coupled to receive a respective one of m logical controls signals that correspond to the m least significant bits of the n bit wiper address, the m switches coupled to the m impedance units of the second set of impedance units are each coupled to receive a respective one of m complementary logical control signals, and the $2^p$ tap switches coupled to the impedance units of the third set of impedance units are each coupled to receive a respective one of plural logical control signals that are decoded from the p most significant bits of the n bit wiper address.

A fourth embodiment, exemplified by FIG. 6, is similar to the second embodiment described above, but has a different second stage. The second stage includes mirror image third and fourth sets of $2^p-1$ identical impedance units in series with each other and with the first and second sets of impedance units, and mirror image third and fourth sets of $2^p-1$ shunt switches. Each of the $2^p-1$ impedance units of each of the third and fourth sets of impedance units has an impedance value of $I_0/(2^p-1)$. The $2^p-1$ shunt switches of the third set are each coupled to receive a respective one of plural logical control signals obtained by a decoding of the p least significant bits of the n bit wiper address. The $2^p-1$ shunt switches of the fourth set are each coupled to receive a respective one of plural logical control signals obtained by a complementing the logical control signals provided to the third set of shunt switches.

A fifth embodiment, exemplified by FIG. 7, is similar to the fourth embodiment described above, but has the additional variations of the third embodiment. In particular, each of the $2^p-1$ impedance units of each of the third and fourth sets of impedance units has an impedance value of $I_0*2^m$. In addition, the m switches coupled to the m impedance units of the first set are coupled to receive m logical controls signals that correspond to the m least significant bits of the n bit wiper address, the m switches coupled to the m impedance units of the second set of impedance units are coupled receive m complementary logical control signals, and the third and fourth sets of $2^p-1$ shunt switches receive logical control signals obtained by a decoding of the p most significant bits of the n bit wiper address.

These and other aspects of the present invention may be further understood by reference to the following detailed description, and the accompanying drawings, of the exemplary embodiments.

BRIEF DESCRIPTION OF THE DRAWINGS

Common reference numerals are used throughout the drawings and the detailed description to indicate like elements.

DETAILED DESCRIPTION

Practitioners will appreciate that an impedance string of a digital potentiometer, including those described in detail below, may be implemented with resistors, capacitors, or inductors, or a combination of resistors, capacitors, and/or inductors. "Impedance" is a term that encompasses both the resistance provided by resistors, and the reactance provided by capacitors and inductors. The term "impedance unit," therefore, includes devices that may be entirely resistive, entirely reactive, or a combination of resistive and reactive. For ease of explanation and simplicity of the figures, our exemplary digital potentiometers use resistors as the impedance units of the impedance string. Practitioners should understand, however, that the resistors could be replaced by reactance elements, or a combination of resistors and reactance elements.

Figure 2:
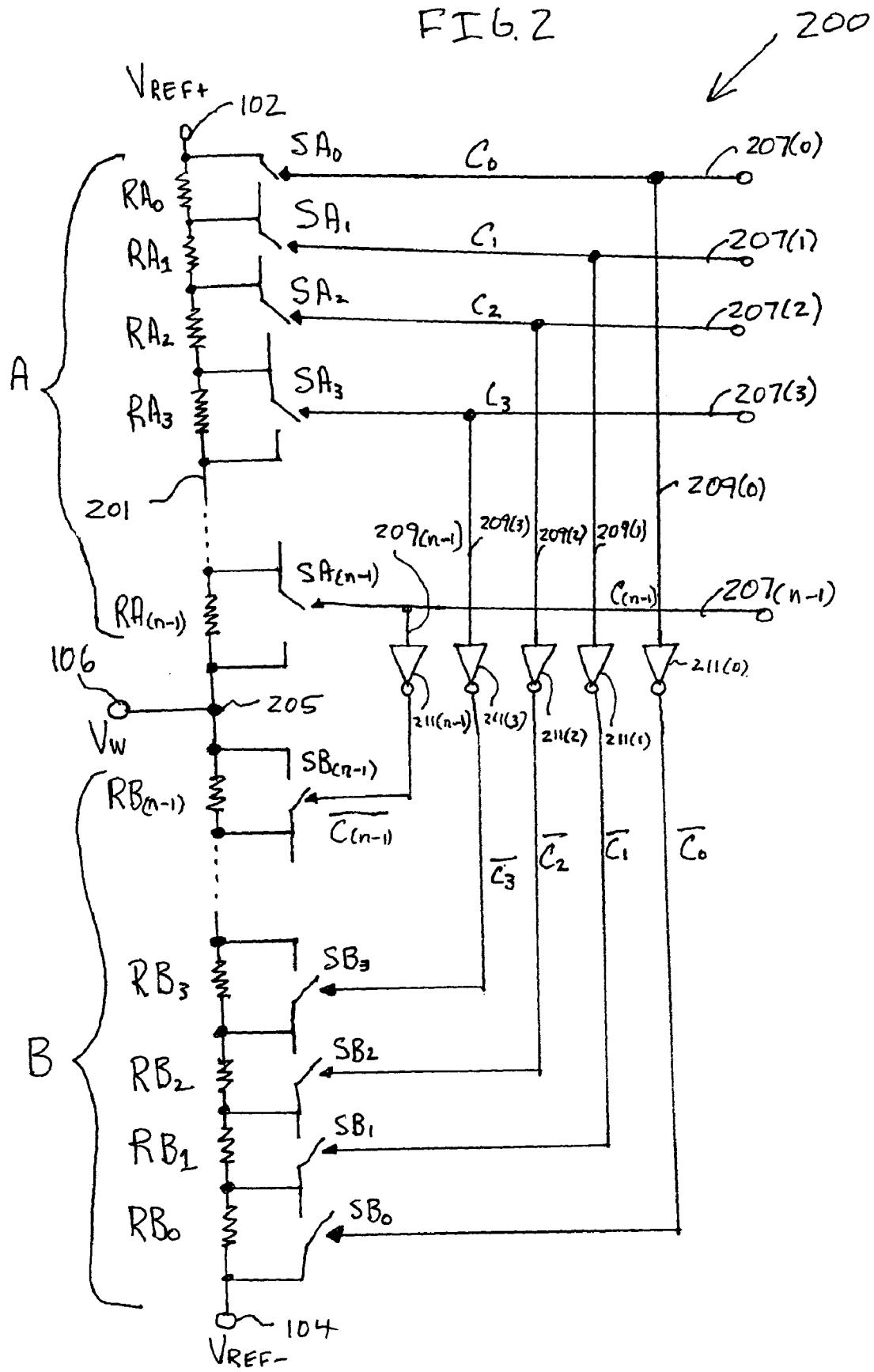
FIG. 2 is a schematic diagram of a digital potentiometer in accordance with a first embodiment of the present invention.

FIG. 2 illustrates a digital potentiometer 200, in accordance with one embodiment of the present invention. Digital potentiometer 200 receives an n-bit wiper address, and has $2^n$ wiper positions. In this example, a minimum value of n is 2, i.e., n is an integer, with $n \geq 2$.

In particular, digital potentiometer 200 includes a string 201 of resistors coupled in series between a high reference voltage ($V_{REF+}$) terminal 102 and a low reference voltage ($V_{REF-}$) terminal 104. The low reference voltage ($V_{REF-}$) may be ground (0.0 V). The number of resistors of string 201 is 2n, where n is the number of bits in the wiper address.

A central node 205 bisects string 201 into two identical sets of n resistors: (1) a first set A between terminal 102 and node 105; and (2) a second set B between node 205 and terminal 104. Output terminal 106 is coupled to central node 205, and collects output voltage $V_w$ therefrom. The value of output voltage $V_w$ varies according to the n-bit wiper address input into digital potentiometer 200.

First set A of string 201 includes n resistors $RA_0$–$RA_{n-1}$, which are coupled in series between terminal 104 and node 205. A first resistor $RA_0$ of first set A is coupled between terminal 104 and a second resistor $RA_1$. A last resistor $RA_{n-1}$ of first set A is coupled between a next-to-last resistor $RA_{n-2}$ (not shown) and node 205. The resistors $RA_0$–$RA_{n-1}$ of first set A all have unique resistance values. The first resistor $RA_0$ has a lowest, base resistance value $R_0$. Beginning with resistor $RA_1$ and proceeding to the last resistor $RA_{n-1}$ of first set A, each successive resistor $RA_1$–$RA_{n-1}$ has a resistance that is greater than the resistance value of the immediately preceding resistor by a power of two. In other words, the n resistors of the first set A increment in resistance value according to the formula $R_0*2^X$, where $R_0$ is a selected base resistance value and X is a series of integers between and inclusive of zero through (n-2). Accordingly, the resistance of first resistor $RA_0$ is $R_0*2^0$ (i.e., $R_0$), the resistance of second resistor $RA_1$ is $R_0*2^1$, the resistance of third resistor $RA_2$ is $R_0*2^2$, and so on, with the resistance of the last resistor $RA_{n-1}$ of first set A being $R_0*2^{(n-1)}$.

Likewise, second set B of string 201 includes n resistors $R_0$–$R_{n-1}$, which are coupled in series between terminal 104 and node 205, and are in series with the resistors of first set A. A first resistor $RB_0$ of second set B is coupled between terminal 102 and a second resistor $RB_1$. A last resistor $RB_{n-1}$ of second set B is coupled between a next-to-last resistor $RB_{n-2}$ (not shown) and node 205. As with the resistors of first set A, the resistors $RB_0$–$RB_{n-1}$ of second set B all have unique resistance values. The first resistor $RB_0$ has the base resistance value $R_0$, the same as first resistor $RA_0$ of first set A. Beginning with resistor $RB_1$ and proceeding to the last resistor $RB_{n-1}$ of second set B, each successive resistor $RB_1$–$RB_{n-1}$ has a resistance that is greater than the resistance value of the immediately preceding resistor by a power of two. In other words, the n resistors of the second set B of resistors also increment in resistance according to the formula $R_0*2^X$, where $R_0$ is a selected base resistance and X is the series of integers between and inclusive of zero through (n-2). Thus, the combined resistance of the first set A of resistors $RA_0$–$RA_{(n-1)}$ is equal to the combined resistance of the second set B of resistors $RB_0$–$RB_{n-1}$.

Accordingly, resistor string 201 is symmetrical around node 205, with first set A of string 201 being a mirror image of second set B. Each resistor $RA_X$ of first set A forms a pair with an identical-impedance, symmetrically-disposed (relative to central node 205) resistor $RB_X$ of second set B. For instance, the first resistor $RA_0$ of first set A, which is coupled to terminal 102, has the same impedance value as the first resistor $RB_0$ of second set B, which is coupled to terminal 104. Similarly, the second resistor $RA_1$ of first set A, which is coupled between first resistor $RA_0$ and third resistor $RA_2$ of first set A, has the same impedance value as the second resistor $RB_1$ of second set B, which is coupled between first resistor $RB_0$ and third resistor $RB_2$ of second set B. Finally, the last resistor $RA_{n-1}$ of first set A, which is coupled between a next-to-last resistor $RA_{n-2}$ (not shown) and node 205, has the same impedance value as the last resistor $RB_{n-1}$ of second set B, which is coupled between a next-to-last resistor $RB_{n-2}$ (not shown) and node 205. Each resistor of first set A forms a pair with a same-resistance resistor of second set B.

Typically, digital potentiometer 200 is entirely implemented within a single integrated circuit. The particular manner of implementing resistor string 201 in an integrated circuit may vary. For instance, in one implementation, each resistor of the resistor sets $RA_0$–$RA_{n-1}$ and $RB_0$–$RB_{n-1}$ may be implemented as a single uniquely sized resistor. Alternatively, for ease of manufacture, one resistor of the resistor set $RA_0$–$RA_{n-1}$ and a corresponding resistor of the resistor set $RB_0$–$RB_{n-1}$ may be implemented as a single resistor, and the other resistors of the resistor sets $RA_0$–$RA_{n-1}$ and $RB_0$–$RB_{n-1}$ may be formed as parallel or series combinations of the single resistor.

For instance, in a parallel resistor implementation, each of the two maximum resistance resistors $RA_{n-1}$ and $RB_{n-1}$, which have the same resistance $R_0*2^{(n-1)}$, may be implemented as a single same-resistance resistor, and each the other resistors $RA_0$–$RA_{n-2}$ and $RB_0$–$RB_{n-2}$ may be implemented as a unique number of parallel resistors, with each of the parallel resistors having a resistance of $R_0*2^{(n-1)}$. For instance, in such an implementation, each of the two second largest resistors $RA_{n-2}$ and $RB_{n-2}$ (which have the same resistance) may be implemented as two parallel resistors, with each of the two parallel resistors having a resistance of $R_0*2^{(n-1)}$, and so on.

Alternatively, in a series resistor implementation, each of the two minimum resistance resistors $RA_0$ and $RB_0$, which have the same resistance $R_0$, may be implemented as a single same-resistance resistor, and each the other resistors $RA_1$–$RA_{n-1}$ and $RB_0$–$RB_{n-1}$ may be implemented as a unique number of in-series resistors, with each of the in-series resistors of the particular resistor $RA_1$–$RA_{n-1}$ and $RB_1$–$RB_{n-1}$ having a resistance of $R_0$. For instance, in such an implementation, each of the two second smallest resistors $RA_1$ and $RB_1$ (which have the same resistance) may be implemented as two in-series resistors, with each of the two in-series resistors having a resistance of $R_0$, and so on.

Digital potentiometer 200 also includes 2n shunt switches that are each coupled to resistor string 201. In particular, a first set of half of the switches (i.e., n shunt switches $SA_0$–$SA_{n-1}$) are coupled to first set A of string 201, and a second set of the other half of the switches (i.e., n shunt switches $SB_0$–$SB_{n-1}$) are coupled to second set B of string

201. Each of the n switches $SA_0$–$SA_{n-1}$ is coupled in parallel with a respective one of the resistors $RA_0$–$RA_{n-1}$ of first set A of string 201, and each of the n switches $SB_0$–$SB_{n-1}$ is coupled in parallel with a respective one of the resistors $RB_0$–$RB_{n-1}$ of second set B. In other words, each of the two terminals of the respective switch is coupled to a respective one of the two ends of the respective resistor with which the switch is coupled in parallel. Accordingly, the 2n switches of digital potentiometer 200 are symmetrical around node 205, with the n switches $SA_0$–$SA_{n-1}$ that are coupled to first set A of string 201 being a mirror image of the n switches $SB_0$–$SB_{n-1}$ that are coupled to second set B of string 201.

Each of the switches $SA_0$–$SA_{n-1}$ and $SB_0$–$SB_{n-1}$ is operable to bypass, i.e., short circuit, and not bypass, the particular resistor $RA_0$–$RA_{n-2}$ and $RB_0$–$RB_{n-2}$ with which the particular switch is coupled in parallel. For instance, switch $SA_0$ is operable to bypass and not bypass resistor $RA_0$ of first set A of string 201, and switch $SB_0$ is operable to bypass and not bypass the same-resistance resistor $RB_0$ of second set B. The state of the respective switches $SA_0$–$SA_{n-1}$ and $SB_0$–$SB_{n-1}$ depends on the state of a logical control signal received by the particular switch.

The switches $SA_0$–$SA_{n-1}$ that are coupled to the first set A of string 201 are each operated by a respective one of n logical control signals $C_0$–$C_{n-1}$ that are provided to the respective switches $SA_0$–$SA_{n-1}$ via respective control lines 207(0)–207(n−1). For example, the first switch $SA_0$ is operated by a control signal $C_0$, and the last switch $SA_{n-1}$ is operated by a control signal $C_{n-1}$. The control signals $C_0$–$C_{n-1}$ may be an n-bit wiper address, and may be provided to digital potentiometer 200 from a source external to the integrated circuit containing digital potentiometer 200, or may be provided by a circuit on the same integrated circuit as digital potentiometer 200, such a memory circuit (volatile or nonvolatile), a processor circuit, or a logic circuit.

On the other hand, the switches $SB_0$–$SB_{n-1}$ that are coupled to the second set B of string 201 are each operated by a respective one of n logical control signals $/C_0$–$/C_{n-1}$ that are complementary to the control signals $C_0$–$C_{n-1}$ that are provided to the switches $SA_0$–$SA_{n-1}$. For example, the first switch $SB_0$ that is in parallel with the first resistor $RB_0$ of second set B is operated by a control signal $/C_0$, which is complementary to the control signal $C_0$ that operates the mirror image switch $SA_0$ that is in parallel with the corresponding, same-resistance resistor $RA_0$ of string A. Similarly, the last switch $SB_{n-1}$ that is in parallel with the last resistor $RB_{n-1}$ of second set B is operated by a control signal $/C_{n-1}$, which is complementary to the control signal $C_{n-1}$ that that operates the mirror image switch $SA_{n-1}$ that is in parallel with the corresponding, same-resistance resistor $RA_{n-1}$ of string A.

The control signals $/C_0$–$/C_{n-1}$ are provided to the respective switches $SB_0$–$SB_{n-1}$ via respective of control lines 209(0)–209(n−1). Each of the control lines 209(0)–209(n−1) is coupled to a respective one of the control lines 207(0)–207(n−1), and includes a respective one of a plurality of inverters 211(0)–211(n−1). The respective inverters 211(0)–211(n−1) invert the respective control signals $C_0$–$C_{n-1}$ into the complementary control signals $/C_0$–$/C_{n-1}$.

In operation, digital potentiometer 200 receives an n-bit wiper address as control signals $C_0$–$C_{n-1}$ via respective control lines 207(0)–207(n−1). The n-bit wiper address corresponds to a unique wiper voltage $V_w$ to be provided at node 205 and output terminal 106. The appropriate ones of control signals $C_0$–$C_{n-1}$ are provided via control lines 207(0)–207(n−1) to the appropriate ones of the switches $SA_0$–$SA_{n-1}$, which are coupled to the first set A of string 201. The appropriate ones of control signals $C_0$–$C_{n-1}$ also are provided via the respective control lines 209(0)–209(n−1) to the appropriate ones of inverters 211(0)–211(n−1), which invert the respective control signals $C_0$–$C_{n-1}$ into the complementary control signals $/C_0$–$/C_{n-1}$. The complementary control signals $/C_0$–$/C_{n-1}$ are then provided via the respective control lines 209(0)–209(n−1) to the appropriate ones of the switches $SB_0$–$SB_{n-1}$, which are coupled to the second set B of string 201.

Upon receipt of the respective control signals $C_0$–$C_{n-1}$ and $/C_0$–$/C_{n-1}$, the respective switches $SA_0$–$SA_{n-1}$ and $SB_0$–$SB_{n-1}$ either open or close, depending on the logical state of the particular control signal received by the particular switch. For instance, a logical zero control signal may cause a particular switch $SA_0$–$SA_{n-1}$ and $SB_0$–$SB_{n-1}$ that is implemented as a transistor to be in an off state (i.e., open switch), whereas a logical one control signal may cause the particular switch to be in an on state (i.e., closed switch). When a particular switch $SA_0$–$SA_{n-1}$ and $SB_0$–$SB_{n-1}$ closes in response to a particular signal $C_0$–$C_{n-1}$ and $/C_0$–$/C_{n-1}$ received by the particular switch $SA_0$–$SA_{n-1}$ and $SB_0$–$SB_{n-1}$, respectively, the particular resistor $RA_1$–$RA_{n-1}$ and $RB_1$–$RB_{n-1}$ that is coupled in parallel with the particular switch is bypassed. Conversely, when a particular switch $SA_0$–$SA_{n-1}$ and $SB_0$–$SB_{n-1}$ opens in response to a particular signal $C_0$–$C_{n-1}$ and $/C_0$–$/C_{n-1}$ received by the particular switch $SA_0$–$SA_{n-1}$ and $SB_0$–$SB_{n-1}$, respectively, the particular resistor $RA_1$–$RA_{n-1}$ and $RB_1$–$RB_{n-1}$ that is coupled in parallel with the particular switch is not bypassed. For every resistor $RA_1$–$RA_{n-1}$ that is bypassed due to the logical state of the respective control signal $C_0$–$C_{n-1}$ received by its respective in-parallel switch $SA_0$–$SA_{n-1}$, the same-resistance one of the resistors $RB_1$–$RB_{n-1}$ is not bypassed, because its respective in-parallel switch $SB_0$–$SB_{n-1}$ received one of complementary control signals $/C_0$–$/C_{n-1}$. Accordingly, a constant resistance is maintained between terminals 104 and 102, since for every resistor of first set A of string 201 that is bypassed (not bypassed), the one and only one identical-resistance resistor of second set B is not bypassed (bypassed). The unique voltage $V_w$ that results at node 205 as a result of the complementary bypassing/not bypassing of the resistors of first and second sets A and B of string 201 reflects the unique n-bit wiper address received by digital potentiometer 200.

The switches $SA_0$–$SA_{n-1}$ and $SB_0$–$SB_{n-1}$ each may be implemented as one or more MOSFET transistors that are operated by a logical control signal received at a gate of the transistor(s). For instance, the switches $SA_0$–$SA_{n-1}$ and $SB_0$–$SB_{n-1}$ each may be implemented as single NMOS transistors. Alternatively, the switches $SA_0$–$SA_{n-1}$ and $SB_0$–$SB_{n-1}$ each may be implemented as single PMOS transistors, provided that the control signals $C_0$–$C_{n-1}$ and $/C_0$–$/C_{n-1}$ are complemented. As a further alternative, the switches $SA_0$–$SA_{n-1}$ and $SB_0$–$SB_{n-1}$ each may be implemented as a CMOS combination switch that includes an NMOS transistor and a PMOS transistor in parallel, provided that the appropriate one of the control signals, and its complement, are provided to each of the CMOS combination switches.

To facilitate our reader's understanding of digital potentiometer 200, the following example is provided.

EXAMPLE 1

Assume that the digital potentiometer 200 has a four bit (i.e., n=4) wiper address, and accordingly has $2^4$, i.e., 16, wiper positions. In such an instance, string 201 of digital potentiometer 200 will include a total of eight resistors in series, with four resistors $RA_0$–$RA_3$ in first set A and four resistors $RB_0$–$RB_3$ in second set B of string 201. The mirror image first resistors $RA_0$ and $RB_0$, which are coupled to terminals 104 and 102, respectively, have a same resistance of $2^0 \ast R_0$, i.e., $R_0$. The mirror image second resistors $RA_1$ and $RB_1$ have a resistance of $2^1 \ast R_0$, i.e., $2 \ast R_0$. Mirror image third resistors $RA_2$ and $RB_2$ have a resistance of $2^2 \ast R_0$, i.e., $4 \ast R_0$. Finally, the mirror image fourth resistors $RA_3$ and $RB_3$, which are both coupled to node 205, have a same resistance of $2^3 \ast R_0$, i.e., $8 \ast R_0$. In such a configuration, the total resistance of each of first set A and second set B of string 201 is $2^n - 1 \ast R_0$, i.e., $15 \ast R_0$. Moreover, the digital potentiometer 200 will have a total of eight switches. Four switches $SA_0$–$SA_3$ will be coupled to first set A of string 201, each in parallel with a respective one of the resistors $RA_0$–$RA_3$. Similarly, four switches $SB_0$–$SB_3$ will be coupled to second set B of string 201, each in parallel with a respective one of the resistors $RB_0$–$RB_3$.

Further assume that the digital potentiometer 200 receives an n-bit wiper address $C_0$–$C_3$ of 0000, correlating to the first wiper position, i.e., $V_w = V_{REF-}$. Assuming that the switches $SA_0$–$SA_3$ and $SB_0$–$SB_3$ are closed by a control signal of one and are opened by a control signal of zero, then switches $SA_0$–$SA_3$ are open, so that resistors $RA_0$–$RA_3$ are not bypassed, and $SB_0$–$SB_3$ are closed, so that resistors $RB_0$–$RB_3$ are bypassed. Accordingly, $V_w = V_{REF-}$ because all of the resistors $RB_0$–$RB_3$ of second set B are bypassed.

Now assume that the digital potentiometer 200 receives a n-bit wiper address correlating to the fifth wiper position of the 16 wiper positions of digital potentiometer 200. Accordingly, control signals $C_0$–$C_3$ are 1, 0, 1, and 0, respectively. The complementary control signals /$C_0$–/$C_3$ are 0, 1, 0, and 1 respectively. As a result, switches $SA_0$, $SA_2$, $SB_1$, and $SB_3$ are closed, so that resistors $RA_0$, $RA_2$, $RB_1$, and $RB_3$ are bypassed, and switches $SA_1$, $SA_3$, $SB_0$, and $SB_2$ are open, so that resistors $RA_1$, $RA_3$, $RB_0$, and $RB_2$ are not bypassed. Accordingly, the resistance between the low reference voltage ($V_{REF-}$) terminal 104 and the node 205 is $5 \ast R_0$, i.e., the sum of the resistance of resistors $RB_0$ (i.e., $R_0$) and $RB_3$ (i.e., $4 \ast R_0$), and the resistance between node 205 and the high reference voltage ($V_{REF+}$) terminal 102 is $10 \ast R_0$, i.e., the sum of the resistance of resistors $RA_1$ ($2 \ast R_0$) and $RA_3$ ($8 \ast R_0$).

Now assume that digital potentiometer 200 receives a n-bit wiper address correlating to the thirteenth wiper position of the 16 wiper positions of digital potentiometer 2001. Accordingly, the control signals $C_0$–$C_3$ are 1, 0, 1 and 1, respectively, and the complementary control signals /$C_0$–/$C_3$ are 0, 1, 0, and 0 respectively. As a result, switches $SA_0$, $SA_2$, $SA_3$, and $SB_1$ are closed, so that resistors $RA_0$, $RA_2$, $RA_3$, and $RB_1$ are bypassed, and switches $SA_1$, $SB_0$, $SB_2$, and $SB_3$, are open, so that resistors $RA_1$, $RB_0$, $RB_2$, and $RB_3$ are not bypassed. Accordingly, the resistance between low reference voltage ($V_{REF-}$) terminal 104 and the node 205 is $13 \ast R_0$, i.e., the sum of the resistance of resistors $RB_0$ ($R_0$), RB2 ($4 \ast R_0$) and $RB_3$ ($8 \ast R_0$), and the resistance between node 205 and the high reference voltage ($V_{REF+}$) terminal 102 is $2 \ast R_0$, i.e., the resistance of resistor $RA_1$ ($2 \ast R_0$).

Finally, assume that digital potentiometer 200 receives an n-bit wiper address $C_0$–$C_3$ of 1111, correlating to the $16^{th}$ wiper position, i.e., $V_w = V_{REF+}$. As a result, the switches $SA_0$–$SA_3$ are closed, so that resistors $RA_0$–$RA_3$ are bypassed, and $SB_0$–$SB_3$ are open, so that resistors $RB_0$–$RB_3$ are not bypassed. Accordingly, $V_w = V_{REF+}$ because all of the resistors $RA_0$–$RA_3$ of the first set A of resistors are bypassed.

Figure 1:
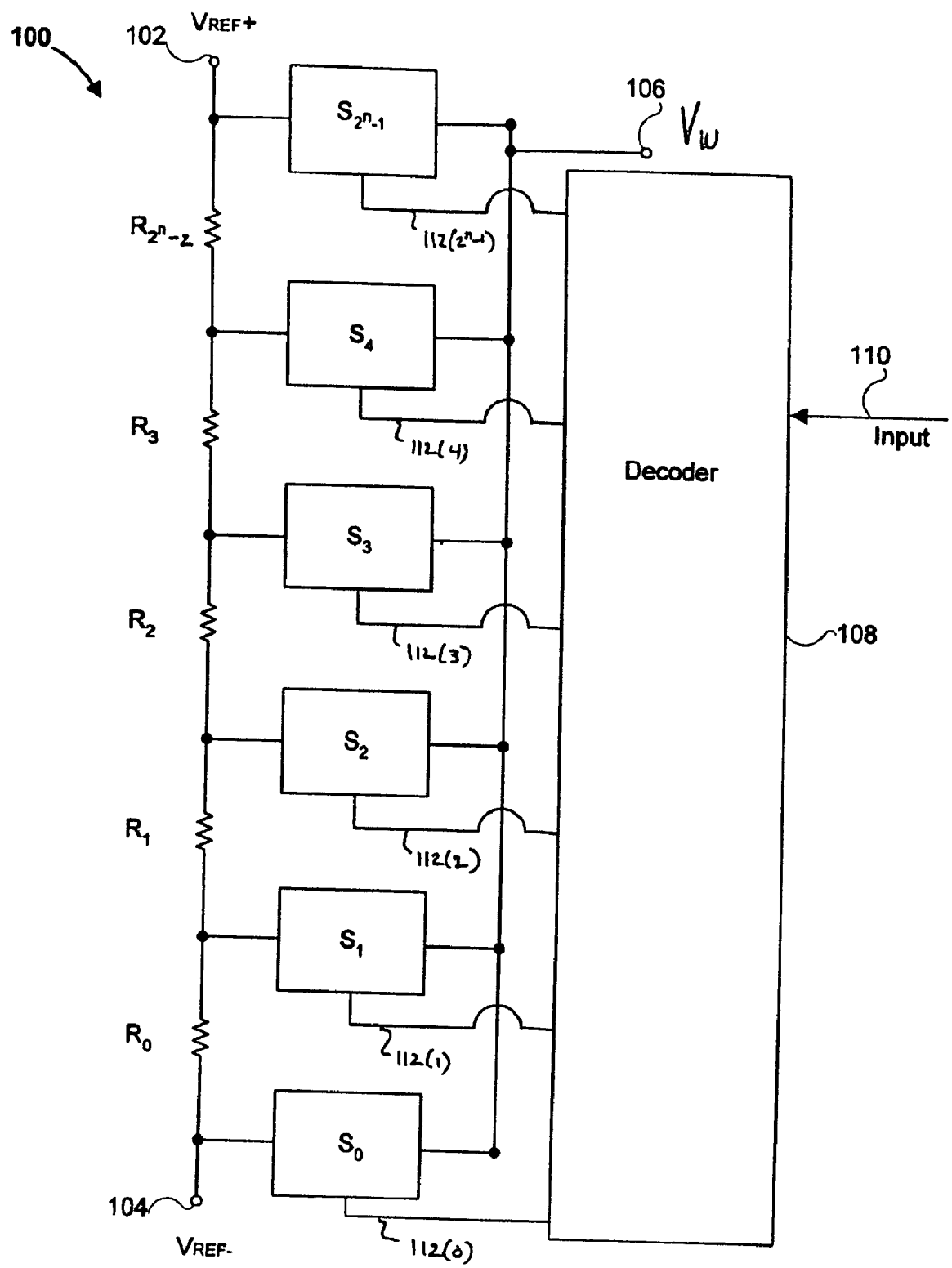
FIG. 1 is a schematic diagram of a conventional digital potentiometer.

In view of the foregoing, the digital potentiometer 200 of Example 1 allows for the same number of wiper addresses (i.e., $2^n$) as the conventional digital potentiometer 100 of FIG. 1, yet accomplishes this result without using a decoder circuit akin to decoder circuit 106 of FIG. 1. A decoder circuit is not used in digital potentiometer 200, because the respective resistors $RA_1$–$RA_{n-1}$ and $RB_1$–$RB_{n-1}$ of the mirror image first and second sets A and B of string 201 increment in resistance by a power of two. As a result, an input n-bit wiper address may directly provide control signals $C_0$–$C_{n-1}$ to actuate the switches $SA_0$–$SA_{n-1}$, while complementary control signals may be used to actuate switches $SB_0$–$SB_{n-1}$.

Further, digital potentiometer 200 has a resistor string 201 that includes fewer resistors, and hence fewer nodes, than the string 101 of digital potentiometer 100 of FIG. 1. In particular, string 201 includes only 2n resistors units, whereas string 101 of FIG. 1 includes $2^n - 1$ resistors. In addition, the digital potentiometer 200 has fewer switches than digital potentiometer 100 of FIG. 1. In particular, digital potentiometer 200 has 2n switches, whereas digital potentiometer 100 has $2^n$ wiper switches. For instance, the four bit digital potentiometer 200 of Example 1 includes eight resistors and eight switches, whereas a four bit digital potentiometer 100 includes 15 resistors and 16 switches.

Depending on the application, it may be appropriate to employ one or more resistors each in parallel with a respective, always-on dummy switch in digital potentiometer 200 to enhance its linearity, as described in a commonly-assigned U.S. patent application Ser. No. 10/660,232, filed on Sep. 10, 2003, which is incorporated herein by reference in its entirety.

In an alternative embodiment, the placement of the resistors of first set A and second set B between terminal 102 and node 205 and between terminal 104 and node 205, respectively, can be varied, such that the first set A and the second set B are not mirror images with respect to node 205. In particular, in digital potentiometer 200, the resistors of first set A sequence from smallest to largest resistance in a direction from terminal 104 to node 205, and the resistors of second set B sequence from the same smallest to largest resistance in a direction from terminal 102 to node 205. Hence, string 201 is symmetrical about node 205, with first set A being a mirror image of second set B. In the alternative embodiment, however, the string 201 may have a same first set A that sequences from smallest to largest resistance in a direction from terminal 104 to node 205, but an inverted second set B that sequences from smallest to largest resistance in a direction from node 205 to terminal 102. This variation only changes the relative positions of the resistors of second set B relative to central node 205 vis-à-vis first set A. The number of resistors, the overall resistance, and the one-to-one correspondence of the resistors of first and second sets A and B would stay the same. Such a configuration would require a change in the arrangement of the control lines 209(0)–209(n-1) to ensure that each resistor of second set B receives the complement of the control signal that is provided to the corresponding, same-resistance resistor of first set A.

In a further alternative embodiment, neither of the upper or second sets A and B of string 201 needs to have its resistors placed in an increasing sequence according to resistance value. In particular, the order of placement of the respective n resistors of first set A and second set B can be random, as long as the control signals $C_0$–$C_{n-1}$ and /$C_0$–/$C_{n-1}$ are properly routed and the power of two relationship of the resistance values of the n resistors is maintained.

Again, while first and second sets A and B would no longer be mirror images with respect to node 205, the number of resistors, the overall resistance, and the one-to-one correspondence of the resistors of first and second sets A and B would stay the same. These alternative embodiments may improve the linearity of the digital potentiometer.

Figure 3:
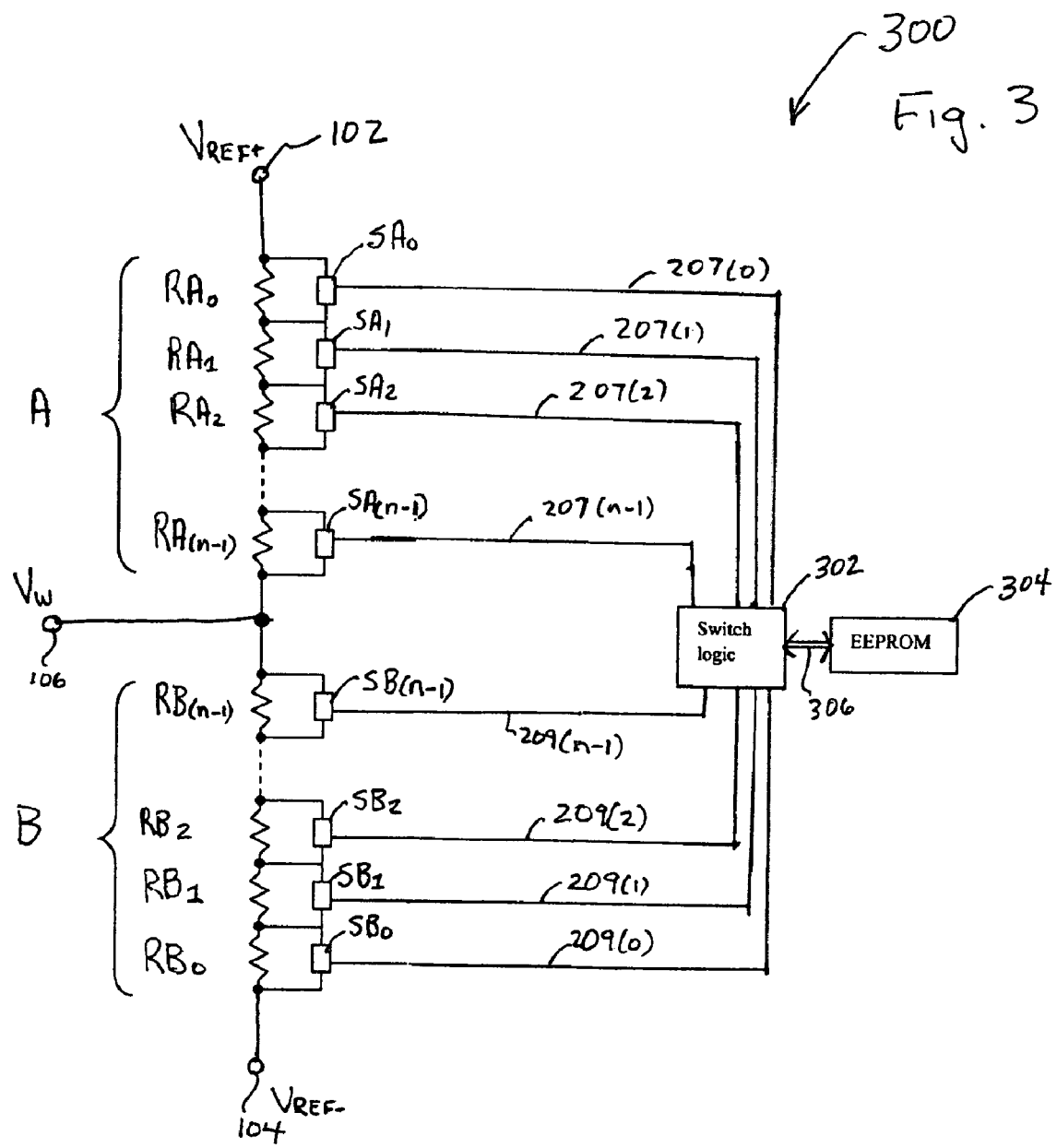
FIG. 3 is an schematic diagram of an exemplary implementation of the digital potentiometer of FIG. 2.

FIG. 3 illustrates a second embodiment of a digital potentiometer in accordance with the present invention. Digital potentiometer 300 of FIG. 3 is identical to digital potentiometer 200 of FIG. 2 with respect to string 201 and switches $SA_0$–$SA_{n-1}$ and $SB_0$–$SB_{n-1}$. Differences between digital potentiometer 300 and digital potentiometer 200 involve the circuitry that provides control signals signal $C_0$–$C_{n-1}$ and /$C_0$–/$C_{n-1}$ to switches $SA_0$–$SA_{n-1}$ and $SA_0$–$SA_{n-1}$, respectively. In particular, digital potentiometer 300 includes a switch logic circuit 302, an electrically erasable programmable read-only memory (EEPROM) 304, and a control line 306 that passes signals between switch logic circuit 302 and EEPROM 304.

EEPROM 304 is a non-volatile memory that stores a state, i.e., a unique n-bit wiper address of digital potentiometer 300. The data stored in EEPROM 304 may be provided to switch logic circuit 302 at system start-up, or in response to a command from a processor (not shown). EEPROM 304 may be replaced by a volatile memory circuit. Switch logic circuit 302 may provide a state of digital potentiometer 300 to EEPROM 304 for storage via control line 306, such as at system power down. Switch logic circuit 302 may also be coupled to receive an n-bit wiper address from another source, which may be internal or external to the integrated circuit containing digital potentiometer 300.

Switch logic circuit 302 receives the n-bit wiper address, either via line 306, or from another source, and outputs the control signals $C_0$–$C_{n-1}$ and the inverted, complimentary control signals /$C_0$–/$C_{n-1}$. Switch logic circuit 302 may also include circuitry that controls the timing of switching of switches $SA_0$–$SA_{n-1}$ and $SB_0$–$SB_{n-1}$. For instance, circuitry within switch logic circuit 302 may require make-before-break switching, or break-before-make switching, among the switches $SA_0$–$SA_{n-1}$ and $SB_0$–$SB_{n-1}$. Switch logic circuit 302 may also include a latch, which stores the n-bit wiper address received from EEPROM 304, and temporarily stores and outputs both control signals $C_0$–$C_{n-1}$ and the inverted control signals /$C_0$–/$C_{n-1}$ to $SA_0$–$SA_{n-1}$ and $SB_0$–$SB_{n-1}$, respectively. Switch logic circuit 302 may also include a parallel to serial register or the like, and an output buffer.

Figure 4:
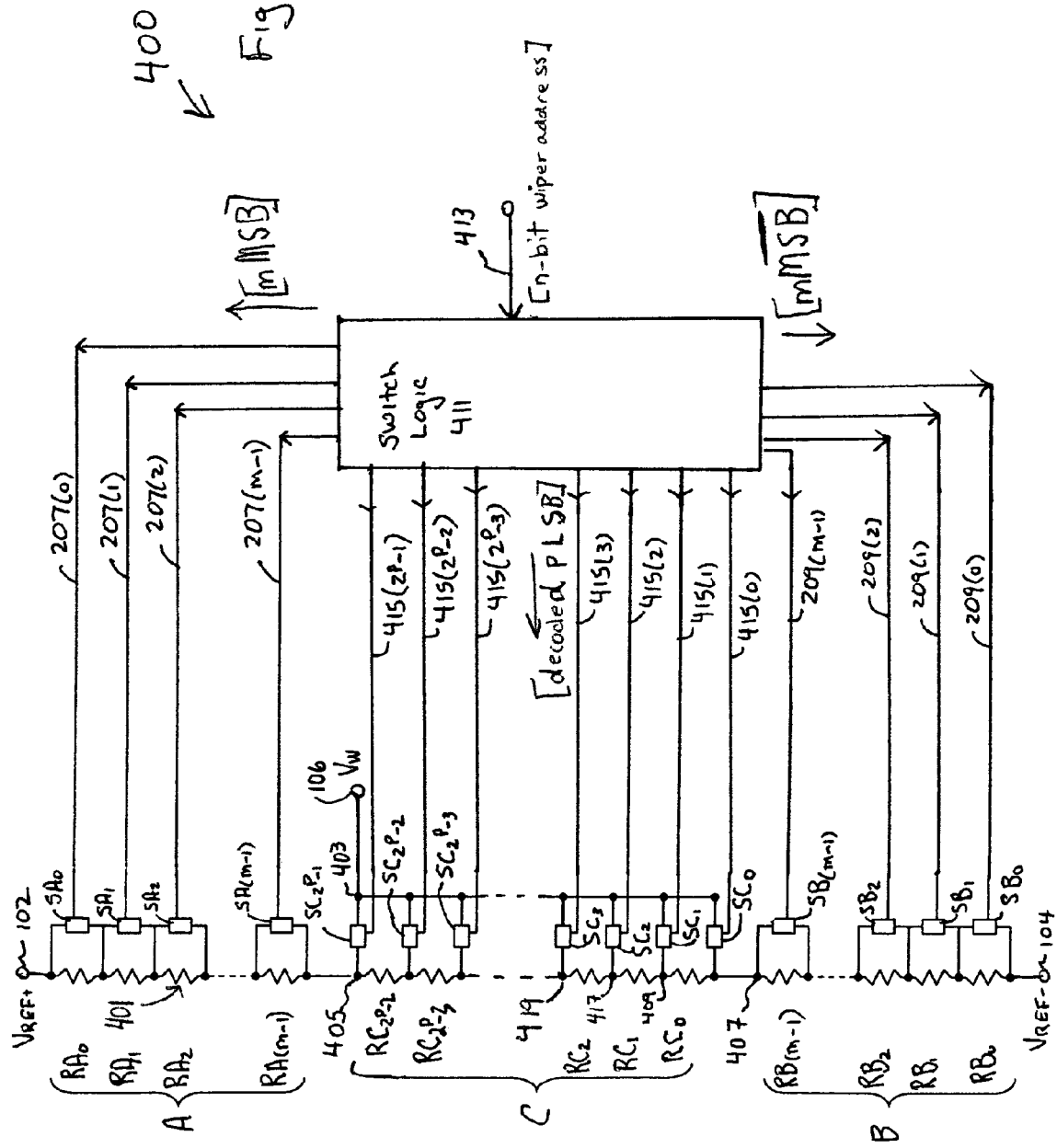
FIG. 4 is a schematic diagram of a digital potentiometer in accordance with a second embodiment of the present invention.

FIG. 4 is alternative embodiment of a digital potentiometer in accordance with the present invention. The digital potentiometer 400 of FIG. 4 is similar to digital potentiometers 200 and 300 of FIGS. 2 and 3, respectively, and has many of the same components. Accordingly, much of the previous discussion applies. Typically, digital potentiometer 400 is entirely implemented within a single integrated circuit.

Similar to digital potentiometers 200 and 300, digital potentiometer 400 receives an n-bit wiper address, and has $2^n$ wiper positions. In this case, n is an integer with a value of at least three, i.e., n≧3. Digital potentiometer 400 differs from digital potentiometers 200 and 300 in that digital potentiometer 400 has a two stage design, in that the range of in-series resistances of digital potentiometer 400 is divided into two parts: (1) a range provided by the resistors of the first set A and the identical second set B of resistor string 401; and (2) a range provided by the resistors of third set C of resistor string 401. By contrast, digital potentiometers 200 and 300 are single stage designs. With a two stage design, it may be possible to implement a given number of wiper addresses with even fewer numbers of resistors and switches than is achievable using a single stage design.

As is discussed in detail below, the digital potentiometer 400 includes a string 401 of resistors coupled in series between a high reference voltage ($V_{REF+}$) terminal 102 and a low reference voltage (VREF−) terminal 104. A plurality of switches are coupled to string 401. The switches are controlled by logical control signals that are provided to the respective switches by switch logic circuit 411. The logical control signals output by switch logic circuit 411 are determined by the value of an n-bit wiper address received by switch logic circuit 411 via line 413. The n-bit wiper address may be provided to line 413 by a source external to the integrated circuit containing digital potentiometer 400. Alternatively, the n-bit wiper address may be provided to line 413 by a circuit on the same integrated circuit as the digital potentiometer 400, such a memory circuit (volatile or nonvolatile memory, e.g., an EEPROM), a processor circuit, or a logic circuit. The output voltage $V_w$ appropriate to the n-bit wiper address is collected at terminal 106.

Resistor string 401 of digital potentiometer 400 is segmented into three in-series sets of resistors: (1) a first set A between the high reference voltage ($V_{REF+}$) terminal 102 and a node 405 of resistor string 401; (2) a second set B between the low reference voltage (VREF−) terminal 104 and a node 407 of resistor string 401; and (3) a third set C between nodes 405 and 407. First set A and second set B of string 401 are identical, and are mirror images of each other relative to third set C of string 401. Alternatively, as was discussed with respect to digital potentiometer 200, the resistors of first set A and second set B may be arranged differently so that first and second sets A and B are not mirror images with respect to third set C, provided that first and second sets A and B still contain the same number of resistors and the one-to-one correspondence of resistors.

First set A of string 401 includes m resistors $RA_0$–$RA_{m-1}$, which are coupled in series between terminal 104 and node 405. In this case, m is an integer with a value less than n, and with a minimum value of 2, i.e., n≧3>m≧2. The value of m may be selected in cases where n≧4 in order to optimize an implementation of the digital potentiometer 400 for a particular application. Likewise, the second set B of string 401 includes m resistors $RB_0$–$RB_{m-1}$, which are coupled in series between terminal 104 and node 407.

As in digital potentiometer 200, the resistance of the resistors $RA_0$–$RA_{(m-1)}$ of first set A, respectively, and of the resistors $RB_0$–$RB_{(m-1)}$ of second set B, respectively, increments as a power of two. The first resistors $RA_0$, $RB_0$ have the identical base resistance value $2^0 * R_0$, i.e., $R_0$, and each successive resistor $RA_1$–$RA_{(m-1)}$ or $RB_1$–$RB_{(m-1)}$ has a resistance that is greater than the resistance value of the immediately preceding resistor by a power of two. That is, the resistance of identical second resistors $RA_1$, $RB_1$ is $R_0 * 2^1$, the resistance of identical third resistors $RA_2$, $RB_2$ is $R_0 * 2^2$, and so on, with the resistance of the identical last resistors $RA_{m-1}$, $RB_{(m-1)}$ of first and second sets A and B, respectively, being $R_0 * 2^{(m-1)}$. In other words, the n resistors of the first set A and second set B increment in resistance value according to the formula $R_0 * 2^X$, where $r_0$ is a selected base resistance value and X is a series of integers between and inclusive of zero through (m−1). Accordingly, resistor string 401 is symmetrical around third set C of string 401, with first set A of string 401 being a mirror image of second set B. Moreover, the combined resistance of resistors $RA_0$–$RA_{(m-1)}$ of first set A is equal to the combined resistance of resistors $RB_0$–$RB_{(m-1)}$ of second set B. Each resistor of first set A forms a pair with a same-resistance resistor of second set B.

Third set C of string 401 includes $2^p-1$ resistors $RC_0$–$RC_{2^p-2}$ in series with each other and with first and second sets A and B, wherein p=(n−m). In this case, since n≧3>m≧2, p has a minimum value of one, i.e., p≧1. In other words, there is at least one resistor in third set C.

A first resistor $RC_0$ of third set C is coupled to the last resistor $RB_{m-}$ of second set B at node 407, and to a second resistor $RC_1$ of third set C. A last resistor $RC_{2^p-2}$ of third set C is coupled to a next-to-last resistor $RC_{2^p-3}$ of third set C, and to the last resistor $RA_{(m-1)}$ of first set A of string 401 at node 405.

Each resistor $RC_0$–$RC_{2^p-2}$ of third set C of string 401 is identical, and has a resistance value of $R_0/(2^p-1)$.

Digital potentiometer 400 also includes a plurality of switches that are each coupled to resistor string 401. A total of $2m+2^p$ switches are coupled to string 401, where p=n−m. In particular, a first set of m switches $SA_0$–$SA_{(m-1)}$ is coupled to the resistors of first set A of string 401, a second set of m switches $SB_0$–$SB_{(m-1)}$ are coupled to the resistors of second set B of string 401, and a third set of $2^p$ switches $SC_0$–$SC_{2^p-1}$ is coupled to resistors of third set C of string 401.

As in digital potentiometers 200 and 300, each of the switches $SA_0$–$SA_{(m-1)}$ of digital potentiometer 400 is coupled in parallel with a respective one of the resistors $RA_0$–$RA_{(m-1)}$ of first set A, and each of the switches $SB_0$–$SB_{(m-1)}$ is coupled in parallel with a respective one of the resistors $RB_0$–$RB_{(m-1)}$ of second set B. Accordingly, the switches $SA_0$–$SA_{(m-1)}$ and $SB_0$–$SB_{(m-1)}$ are symmetrical around third set C of string 401. Each of the switches $SA_0$–$SA_{(m-1)}$ and $SB_0$–$SB_{(m-1)}$ is operable to bypass and not bypass the particular resistor $RA_0$–$RA_{m-2}$ and $RB_0$–$RB_{m-2}$ with which the particular switch is coupled in parallel.

The state of the respective switches $SA_0$–$SA_{(m-1)}$ and $SB_0$–$SB_{(m-1)}$ depends on the state of a logical control signal received by the particular switch. The switches $SA_0$–$SA_{(m-1)}$ are each operated by a respective one of m logical control signals $C_0$–$C_{(m-1)}$ that are provided to the respective switches $SA_0$–$SA_{(m-1)}$ by switch logic circuit 411 via a respective one of the control lines 207(0)–207(m−1). The control signals $C_0$–$C_{(m-1)}$ respectively correspond to the m most significant bits (i.e., the m MSB's) of the n-bit wiper address provided to switch logic circuit 411 via line 413. On the other hand, the switches $SB_0$–$SB_{(m-1)}$ are each operated by a respective one of m logical control signals $/C_0$–$/C_{(m-1)}$ that are provided to the respective switches $SB_0$–$SB_{(m-1)}$ by switch logic circuit 411 via respective ones of control lines 209(0)–209(m−1). The control signals $/C_0$–$/C_{(m-1)}$ are complementary to the control signals $C_0$–$C_{(m-1)}$ that are provided to the switches $SA_0$–$SA_{m-1}$. In other words, the control signals $/C_0$–$/C_{(m-1)}$ respectively are complements of the m MSB's of the n-bit wiper address provided to switch logic circuit 411 via line 413. For example, the first switch $SB_0$ that is in parallel with the first resistor $RB_0$ of second set B is operated by a control signal $/C_0$, which is complementary to the control signal $C_0$ that operates the mirror image switch $SA_0$ that is in parallel with the corresponding, same-resistance mirror image resistor $RA_0$ of string A. Control signal $C_0$ is the $p^{th}$ bit (i.e., bit (n−m) where the LSB is considered bit zero) of the n-bit wiper address. Similarly, the last switch $SB_{(m-1)}$ that is in parallel with the last resistor $RB_{(m-1)}$ of second set B is operated by a control signal $/C_{m-1}$, which is complementary to the control signal $C_{(m-1)}$ that that operates the mirror image switch $SA_{(m-1)}$ that is in parallel with the corresponding, same-resistance mirror image resistor $RA_{(m-1)}$ of string A. Control signal $C_{(m-1)}$ is the last bit (i.e., the MSB or bit (n−1) of the n-bit wiper address.

The $2^p$ switches $SC_0$–$SC_{2^p-1}$ that are coupled to third set C of string 401 are similar to the wiper switches $S_0$–$S_{2^n-1}$ of digital potentiometer 100 of FIG. 1. Each switch $SC_0$–$SC_{2^p-1}$ includes a first terminal that is coupled to a respective one of the $2^p$ nodes of third set C of string 401, a second terminal that is coupled to a common node 403, and a control terminal. Common node 403 is coupled to output terminal 106. Moreover, each of the $2^p$ switches $SC_0$–$SC_{2^p-1}$ taps a different node in third set C of resistor string 401, including the two ends of third set C and any internal nodes of third set C. For example, the first switch $SC_0$ has its first terminal coupled to node 407, which is formed by the joined ends of the last resistor $RB_{m-2}$ of second set B and the first resistor $RC_0$ of third set C. Similarly, the second switch $SC_1$ has its first terminal coupled to a node 409 of third set C of string 401, which is between the joined ends of first and second resistors $RC_0$ and $RC_1$ of third set C. Finally, the last switch $SC_{2^p-1}$ has its first terminal coupled to node 405, which is formed by the joined ends of the last resistor $RC_{2^p-2}$ of third set C and the last resistor $RB_{(m-1)}$ of second set B of string 401. Typically, the switches $SC_0$–$SC_{2^p-1}$ may be implemented by one or more MOSFET transistors, as described above with respect to switches $SA_0$–$SA_{n-1}$ and $SB_0$–$SB_{n-1}$.

In the operation of digital potentiometer 400, only one of the tap switches $SC_0$–$SC_{2^p-1}$ will be closed in response to any given n-bit wiper address. All of the other switches $SC_0$–$SC_{2^p-1}$ will be open. The state of each of the switches $SC_0$–$SC_{2^p-1}$ is determined by a respective one of $2^p$ logical control signals $CC_0$–$CC_{2^p-1}$ that are provided to the respective switches $SC_0$–$SC_{2^p-1}$ by switch logic circuit 411 via respective ones of control lines 415(0)–415($2^p-1$). The state of the respective control signals $CC_0$–$CC_{2^p-1}$ is determined by switch logic circuit 411 through a decoding of the p least significant bits, i.e., the p LSB's or bits zero through bit (p−1), of the n-bit wiper address received by switch logic circuit 411 via line 413. Assuming that the respective switches $SC_0$–$SC_{2^p-1}$ are closed in response to a logical one control signal, and open in response to a logical zero control signal, then one of the control signals $CC_0$–$CC_{2^p-1}$ will be a logical one in response to an input n-bit wiper address, and all of the other control signals $CC_0$–$CC_{2^p-1}$ will be logical zero, so that only one of the switches $SC_0$–$SC_{2^p-1}$ is on to tap string 401. Closing a selected one of the switches $SC_0$–$SC_{2^p-1}$, in combination with the operation of the switches $SA_0$–$SA_{(m-1)}$ and the complementary operation of switches $SB_0$–$SB_{m-1}$, provides a unique ratio between the resistance values of the two resistor sub-chains connected to wiper terminal 106 via the single closed one of the switches $SC_0$–$SC_{2^p-1}$.

As mentioned, switch logic circuit 411 includes circuitry (such a latch) for receiving an input n bit wiper address, routing the m MSB's of the n-bit wiper address to the switches $SA_0$–$SA_{(m-1)}$ in the form of control signals $C_0$–$C_{m-1}$, and for inverting the m-MSB's of the n-bit wiper address to form control signals $/C_0$–$/C_{m-1}$ and routing the control signals $/C_0$–$/C_{m-1}$ to the switches $SB_0$–$SB_{(m-1)}$ in the form of control signals $/C_0$–$/C_{m-1}$. Switch logic circuit 411 also includes circuitry for decoding the p LSB's of the n-bit wiper address and routing each of the resulting control signals $CC_0$–$CC_{2^p-1}$ to the appropriate one of the switches $SC_0$–$SC_{2^p-1}$. Switch logic circuit 411 may also include circuitry that controls the timing of the switching of the switches $SA_0$–$SA_{m-1}$, $SB_0$–$SB_{m-1}$, and $SC_0$–$SC_{2^p-1}$. For instance, circuitry within switch logic circuit 302 may require make-before-break switching or break-before-make switching among the various switches. Switch logic circuit 411 may also include circuitry, such as registers or latches, to store an input n-bit wiper address, to store the resulting state of the control signals $C_0$–$C_{m-1}$, $/C_0$–$/C_{m-1}$, and $CC_0$–$CC_{2^p-1}$, and to output the n-bit wiper address or control signals $C_0$–$C_{m-1}$, $/C_0$–$/C_{m-1}$, and $CC_0$–$CC_{2^p-1}$ to external circuitry. Switch logic circuit 411 may also include a parallel to serial register or the like.

To facilitate our reader's understanding of digital potentiometer 400, the following examples are provided.

EXAMPLE 2

Assume that the digital potentiometer 400 has an eight bit (i.e., n=8) wiper address, and accordingly has $2^8$, i.e., 256, wiper positions. As mentioned, the value of m may be selected in cases where $n \geq 4$, provided that $m \geq 2$, in order to optimize the number of resistors and switches of the digital potentiometer 400 for a particular application. For this example, assume that m=4, so that p=4, i.e., n–m=4. In such a case, string 401 will include a total of 23 resistors in series, with four resistors $RA_0$–$RA_3$ in first set A, four resistors $RB_0$–$RB_3$ in second set B, and fifteen resistors $RC_0$–$RC_{14}$ in third set C.

Within the first and second sets A and B of string 401, the mirror image first resistors $RA_0$ and $RB_0$, which are coupled to terminals 104 and 102, respectively, have a same resistance of $2^0*R_0$, i.e., $R_0$. The mirror image second resistors $RA_1$ and $RB_1$ have a resistance of $2^1*R_0$, i.e., $2R_0$. The mirror image third resistors $RA_2$ and $RB_2$ have a resistance of $2^2*R_0$, i.e., $4*R_0$. Finally, the mirror image fourth resistors $RA_3$ and $RB_3$, which are coupled to nodes 405 and 407, respectively, have a same resistance of $2^3*R_0$, i.e., $8*R_0$. The total resistance of each of first set A and second set B of string 401 is $2^m-1*R_0$, i.e., $15*R_0$. Each of the fifteen resistors $RC_0$–$RC_{14}$ in third set C of string 401 has a resistance of $R_0/(2^p-1)$, which is $R_0/15$. The entire effective resistance of string 401 between terminals 102 and 104 will be $16*R_0$, assuming that half of the combined resistance of first and second sets A and B is bypassed for any given n-bit wiper address.

The digital potentiometer 400 also will include a total of 24 switches. Four switches $SA_0$–$SA_3$ will be coupled to first set A of string 401, each in parallel with a respective one of the resistors $RA_0$–$RA_3$. Similarly, four switches $SB_0$–$SB_3$ will be coupled to second set B of string 401, each in parallel with a respective one of the resistors $RB_0$–$RB_3$. Finally, sixteen (i.e., $2^p$) switches $SC_0$–$SC_{15}$ will be coupled to respective ones of the nodes of third set C of string 401. For instance, the first switch $SC_0$ will have one of its terminals connected to the end of the first resistor $RC_0$ of third set C at node 407 and the other of its terminals connected to node 403. The second switch $SC_1$ will have one of its terminals connected to the joined ends of resistors $RC_0$ and $RC_1$ at internal node 409 and the other of its terminals connected to node 403. Finally, the last switch $SC_{15}$ will have one of its terminals connected to end of the last resistor $RC_{15}$ of third set C at node 405 and the other of its terminals connected to node 403.

Now assume that the digital potentiometer 400 receives an eight-bit wiper address of 00000000, which corresponds to the first wiper position, i.e., $V_w = V_{REF-}$. In response, switch logic circuit 411 will output 24 controls signals $C_0$–$C_3$, $/C_0$–$/C_3$, and $CC_0$–$CC_{15}$ to the switches $SA_0$–$SA_3$, $SB_0$–$SB_3$, and $SC_0$–$SC_{15}$, respectively, that will cause the recipient ones of the switches to be either open or closed. As mentioned, the four control signals $C_0$–$C_3$ correspond to the m MSB's of the n-bit wiper address, the four control signals $/C_0$–$/C_3$ are complements of the m MSB's, and the 16 control signals $CC_0$–$CC_{15}$ reflect a decoding of the p LSB's of the n-bit wiper address. One of the control signals $CC_0$–$CC_{15}$, i.e., $CC_0$, will be a logical one, and all of the others will be logical zero.

As a result, digital potentiometer 400 will move to a configuration be such that: (1) the switches $SA_0$–$SA_3$ will be open, so that the resistors $RA_0$–$RA_3$ are not bypassed; (2) the switch $SC_0$ will be closed, so that string 401 is tapped at node 407; (3) the switches $SC_1$–$SC_{15}$ will be off; and (4) the switches $SB_0$–$SB_3$ will be closed, so that the resistors $RB_0$–$RB_3$ are bypassed. Accordingly, the wiper will tap string 401 at node 407, and the entire resistance of string 401 will be between node 407 (i.e., the wiper) and terminal 102. Accordingly, $V_w = V_{REF-}$.

Now assume that the digital potentiometer 400 receives a n-bit wiper address of 00110010, which corresponds to the $50^{th}$ wiper position of the 256 wiper positions of digital potentiometer 400. The p LSB's are 0010, and the m MSB's are 0011. In response, switch logic circuit 411 will output 24 control signals $C_0$–$C_3$, $/C_0$–$/C_3$, and $CC_0$–$CC_{15}$ to the switches $SA_0$–$SA_3$, $SB_0$–$SB_3$, and $SC_0$–$SC_{15}$, respectively, that will cause the recipient ones of the switches to be either open or closed. As a result, the digital potentiometer 400 will move to a configuration such that: (1) the switches $SA_0$ and $SA_1$ will be closed, so that the resistors $RA_0$ and $RA_1$ will be bypassed; (2) the switches $SA_2$ and $SA_3$ will be open, so that the resistors $RA_2$ and $RA_3$ will not be bypassed; (3) switch $SC_2$ will be closed, so that the string 401 is tapped at internal node 417 of third set C of string 401; (4) the switches $SC_0$–$SC_1$ and $SC_3$–$SC_{15}$ will be open; (5) the switches $SB_0$ and $SB_1$ will be open, so that resistors $RB_0$ and $RB_1$ are not bypassed; and (6) the switches $SB_2$ and $SB_3$ will be closed, so that the resistors $RB_2$ and $RB_3$ will be bypassed. Accordingly, the wiper will tap string 401 at node 417. The resistance between node 417 (i.e., the wiper) and terminal 104 will be $(3+2/15)*R_0$, i.e., the sum of the resistances of $RB_0$, $RB_1$, $RC_0$, and $RC_1$, and the resistance between node 417 and terminal 102 will be $(12+13/15)*R_0$, i.e., the resistance of resistors $RA_2$, $RA_3$, and $RC_2$–$RC_{15}$.

Finally, assume that the digital potentiometer 400 receives an eight-bit wiper address of 11111111, which corresponds to the last wiper position, i.e., $V_w = V_{REF+}$. In response, switch logic circuit 411 will output 24 controls signals $C_0$–$C_3$, $/C_0$–$/C_3$, and $CC_0$–$CC_{15}$ to the switches $SA_0$–$SA_3$, $SB_0$–$SB_3$, and $SC_0$–$SC_{15}$, respectively, that will cause the recipient ones of the switches to be either open or closed. In response, the digital potentiometer 400 will move to a configuration such that: (1) the switches $SA_0$–$SA_3$ will be closed, so that resistors $RA_0$–$RA_3$ are bypassed; (2) the switch $SC_{15}$ will be closed, so that string 401 is tapped at node 405; (3) the switches $SC_0$–$SC_{14}$ will be open; and (4) the switches $SB_0$–$SB_3$ will be open, so that the resistors $RB_0$–$RB_3$ are not bypassed. Accordingly, the wiper will tap string 401 at node 405, and the entire resistance of string 401 will be between node 405 (i.e., the wiper) and terminal 104. Accordingly, $V_w = V_{REF+}$.

In view of the foregoing, the eight-bit digital potentiometer 400 of Example 2 allows for the same number of wiper addresses (i.e., 256) as an eight-bit digital potentiometer 100 of FIG. 1, yet accomplishes this result with significantly fewer resistors and switches. In particular, the eight-bit digital potentiometer 400 of the Example 2 has 23 resistors and 24 switches, whereas the eight-bit digital potentiometer 100 has 255 resistors and 256 switches. In addition, while the switch logic circuit 411 of digital potentiometer 400 must do some decoding with respect to the p MSB's of the n-bit wiper address, the amount of decoding, and hence the size of the decoding circuitry, will be less than the amount of decoding done by, and the size of, decoder 108 of digital potentiometer 100 of FIG. 1, since fewer bits of the n-bit wiper address are decoded.

EXAMPLE 3

Assume that another version digital potentiometer 400 has an eight bit (i.e., n=8) wiper address, and accordingly has $2^8$, i.e., 256, wiper positions. As mentioned, the value of m may be selected in cases where n≧4, provided that n≧3>m≧2, in order to optimize the number of resistors and switches of the digital potentiometer 400 for a particular application. For this Example 3, assume that m=5, so that p=3, i.e., n−m=3. In such a case, string 401 will include a total of 17 resistors, with five resistors $RA_0$–$RA_4$ in first set A, five resistors $RB_0$–$RB_4$ in second set B, and seven resistors $RC_0$–$RC_6$ in third set C. The sequential resistors $RA_0$–$RA_4$ and $RB_0$–$RB_4$ will have values of $2^0*R_0$, $2^1*R_0$, $2^2*R_0$, $2^3*R_0$, and $2^4*R_0$, i.e., $R_0$, $2R_0$, $4R_0$, $8R_0$, and $16R_0$, respectively. Moreover, each of the seven resistors $RC_0$–$RC_6$ will have a value of $R_0/(2^3-1)$ i.e., $R_0/7$.

In addition, the digital potentiometer 400 will have 18 switches, including five switches $SA_0$–$SA_4$, five switches $SB_0$–$SB_4$, and eight switches $SC_0$–$SC_7$. In operation, the switch logic circuit 411 will use the five MSB's of the 8-bit wiper address to operate switches $SA_0$–$SA_4$, respectively, will use the complements of the five MSB's to operate switches $SB_0$–$SB_4$, respectively, and will decode the three LSB's of the 8-bit wiper address to operate the eight switches $SC_0$–$SC_7$.

In view of the foregoing, the eight-bit digital potentiometer 400 of Example 3 allows for the same number of wiper addresses (i.e., 256) as the conventional digital potentiometer 100 of FIG. 1, yet accomplishes this result with significantly fewer resistors and switches. In particular, the eight-bit digital potentiometer 400 of Example 3 has 17 resistors and 18 switches, whereas an eight-bit digital potentiometer 100 has 255 resistors and 256 switches.

The eight-bit digital potentiometer 400 of Example 3 also has fewer resistors and switches than the digital potentiometer 400 of Example 2. As demonstrated, by adjusting the value of m for an n-bit wiper address, the number of resistors and switches of the digital potentiometer 400 can be optimized for a particular application. For instance, in some applications, it may be best to minimize the number of resistors and switches to provide for a more compact layout. In such cases, the value of m will be maximized, provided p≧1. On the other hand, in some applications, having a greater number of smaller size resistors and a greater number of switches may be desirable to achieve a different electrical performance. In such cases, the value of m will be minimized, provided m≧2.

Figure 5:
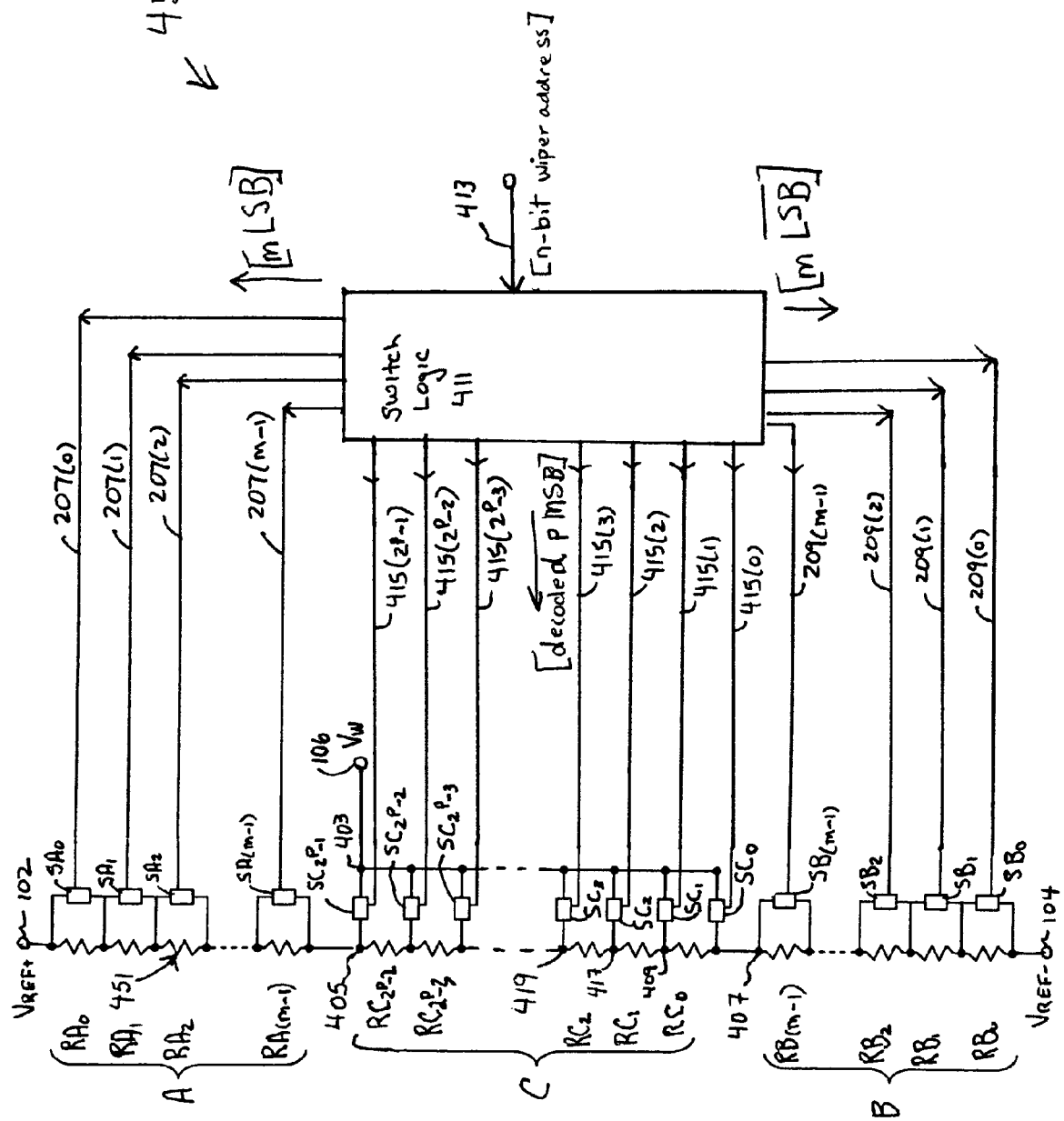
FIG. 5 is a schematic diagram of a digital potentiometer in accordance with a third embodiment of the present invention.

FIG. 5 is alternative embodiment of a digital potentiometer in accordance with the present invention. The digital potentiometer 450 of FIG. 5 is similar to digital potentiometer 400 of FIG. 4, and has many of the same components. For the sake of brevity, our discussion will focus on the two primary differences between digital potentiometers 400 and 450.

First, with respect to the $2^p-1$ resistors $RC_0$–$RC_{2^p-2}$ in of third set C of string 451 of digital potentiometer 450, each resistor $RC_0$–$RC_{2^p-2}$ has an identical resistance of $R_0*2^m$. In particular, each of the resistors $RC_0$–$RC_{2^p-2}$ of third set C has a resistance value equal to the incremental resistance $R_0$ plus either the combined resistance of all of the resistors $RA_0$–$RA_{(m-1)}$ of first set A or the combined resistance of all of the resistors $RB_0$–$RB_{m-}$ of second set B. (As noted, the overall resistance first set A and second set B are equal.). By contrast, in digital potentiometer 400, each resistor $RC_0$–$RC_{2^p-2}$ has an identical resistance of $R_0/(2^p-1)$.

Second, the control signals $C_0$–$C_{(m-1)}$, which are provided to the switches $SA_0$–$SA_{(m-1)}$ of digital potentiometer 450 respectively correspond to the m least significant bits (i.e., the m LSB's) of the n-bit wiper address provided to switch logic circuit 411 via line 413. Similarly, the m logical control signals $/C_0$–$/C_{(m-1)}$ that are provided to the switches $SB_0$–$SB_{(m-1)}$, respectively, by switch logic circuit 411 are complements of the m LSB's of the n-bit wiper address. Finally, the $2^p$ logical control signals $CC_0$–$CC_{2^p-1}$ that are provided to the respective switches $SC_0$–$SC_{2^p-1}$ by switch logic circuit 411 are decoded from the p MSB's of the n-bit wiper address. By contrast, in digital potentiometer 400, the control signals $C_0$–$C_{(m-1)}$ correspond to the m MSB's of the n-bit wiper address, the control signals $/C_0$–$/C_{(m-1)}$ are complements thereof, and the control signals $CC_0$–$CC_{2^p-1}$ are decoded from the p LSB's of the n-bit wiper address.

To facilitate our reader's understanding of digital potentiometer 450, the following examples are provided.

EXAMPLE 4

Assume that the digital potentiometer 450 has an eight bit (i.e., n=8) wiper address, and accordingly has $2^8$, i.e., 256, wiper positions. As mentioned, the value of m may be selected in cases where n≧4, provided that m≧2, in order to optimize the number of resistors and switches of the digital potentiometer 450 for a particular application. For this example, assume that m=4, so that p=4, i.e., n−m=4. In such a case, string 451 will include a total of 23 resistors in series, with four resistors $RA_0$–$RA_3$ in first set A, four resistors $RB_0$–$RB_3$ in second set B, and fifteen resistors $RC_0$–$RC_{14}$ in third set C.

Within the first and second sets A and B of string 451, the mirror image first resistors $RA_0$ and $RB_0$, which are coupled to terminals 104 and 102, respectively, have a same resistance of $2^0*R_0$, i.e., $R_0$. The mirror image second resistors $RA_1$ and $RB_1$ have a resistance of $2^1*R_0$, i.e., $2R_0$. The mirror image third resistors $RA_2$ and $RB_2$ have a resistance of $2^2*R_0$, i.e., $4*R_0$. Finally, the mirror image fourth resistors $RA_3$ and $RB_3$, which are coupled to nodes 405 and 407, respectively, have a same resistance of $2^3*R_0$, i.e., $8*R_0$. The total resistance of each of first set A and second set B of string 451 is $2^m-1*R_0$, i.e., $15*R_0$. Each of the fifteen resistors $RC_0$–$RC_{14}$ in third set C of string 451 has a resistance of $2^m*R_0$, i.e., $16*R_0$, which is one resistance unit $R_0$ greater than the resistance of first set A or second set B of string 451. The entire effective resistance of string 451 between terminals 102 and 104 will be $255*R_0$, assuming that half of the combined resistance of first and second sets A and B is bypassed for any given n-bit wiper address.

Assume that the digital potentiometer 450 receives an n-bit wiper address corresponding to one or the other of the first and last wiper positions, i.e., corresponding to n-bit wiper addresses of 00000000 and 11111111, respectively. In each case, the digital potentiometer 450 has the same configuration as digital potentiometer 400 of Example 2.

Now assume that the digital potentiometer 450 receives a n-bit wiper address of 00110010, which corresponds to the $50^{th}$ wiper position of the 256 wiper positions of digital potentiometer 450. The four (i.e., m) LSB's are 0010, and the four (i.e., p) MSB's are 0011. In response, switch logic circuit 411 will output 24 control signals $C_0$–$C_3$, /$C_0$–/$C_3$, and $CC_0$–$CC_{15}$ to the switches $SA_0$–$SA_3$, $SB_0$–$SB_3$, and $SC_0$–$SC_{15}$, respectively, that will cause the recipient ones of the switches to be either open or closed. As a result, the digital potentiometer 450 will move to a configuration such that: (1) the switches $SA_0$, $SA_2$, and $SA_3$ will be open, so that the resistors $RA_0$, $RA_2$, and $RA_3$ will not be bypassed; (2) the switch $SA_1$ will be closed, so that the resistor $RA_1$ will be bypassed; (3) switch $SC_3$ will be closed, so that the string 451 is tapped at internal node 419 of third set C; (4) the switches $SC_0$–$SC_2$ and $SC_4$–$SC_{15}$ will be open; (5) the switch $SB_1$ will be open, so that resistor $RB_1$ is not bypassed; and (6) the switches $SB_0$, $SB_2$, and $SB_3$ will be closed, so that the resistors $RB_0$, $RB_2$, and $RB_3$ will be bypassed. Accordingly, the wiper will tap string 451 at node 419. The resistance between node 419 (i.e., the wiper) and terminal 104 will be 50*$R_0$, i.e., the sum of the resistances of $RB_1$ and $RC_0$–$RC_2$, and the resistance between node 419 and terminal 102 will be 205*$R_0$, i.e., the resistance of resistors $RA_0$, $RA_2$, $RA_3$, and $RC_3$–$RC_{15}$.

EXAMPLE 5

Assume that another version digital potentiometer 450 has an eight bit (i.e., n=8) wiper address, and accordingly has $2^8$, i.e., 256, wiper positions. Further assume that m=5, so that p=3, i.e., n−m=3. In such a case, string 451 will include a total of 17 resistors, with five resistors $RA_0$–$RA_4$ in first set A, five resistors $RB_0$–$RB_4$ in second set B, and seven resistors $RC_0$–$RC_6$ in third set C. The sequential resistors $RA_0$–$RA_4$ and $RB_0$–$RB_4$ will have values of $2^0*R_0$, $2^1*R_0$, $2^2*R_0$, $2^3*R_0$, and $2^4*R_0$, i.e., $R_0$, $2R_0$, $4R_0$, $8R_0$, and $16R_0$, respectively. Moreover, each of the seven resistors $RC_0$–$RC_6$ will have a value of $2^5*R_0$, i.e., $32R_0$, which is one resistance unit $R_0$ greater than the combined resistance of the first set A or second set B of string 451.

In addition, the digital potentiometer 450 will have 18 switches, including five switches $SA_0$–$SA_4$, five switches $SB_0$–$SB_4$, and eight switches $SC_0$–$SC_7$. In operation, the switch logic circuit 411 will use the five LSB's of the 8-bit wiper address to operate switches $SA_0$–$SA_4$, will use the complements of the five LSB's to operate switches $SB_0$–$SB_4$, and will decode the three MSB's of the 8-bit wiper address to operate the eight switches $SC_0$–$SC_7$.

Figure 6:
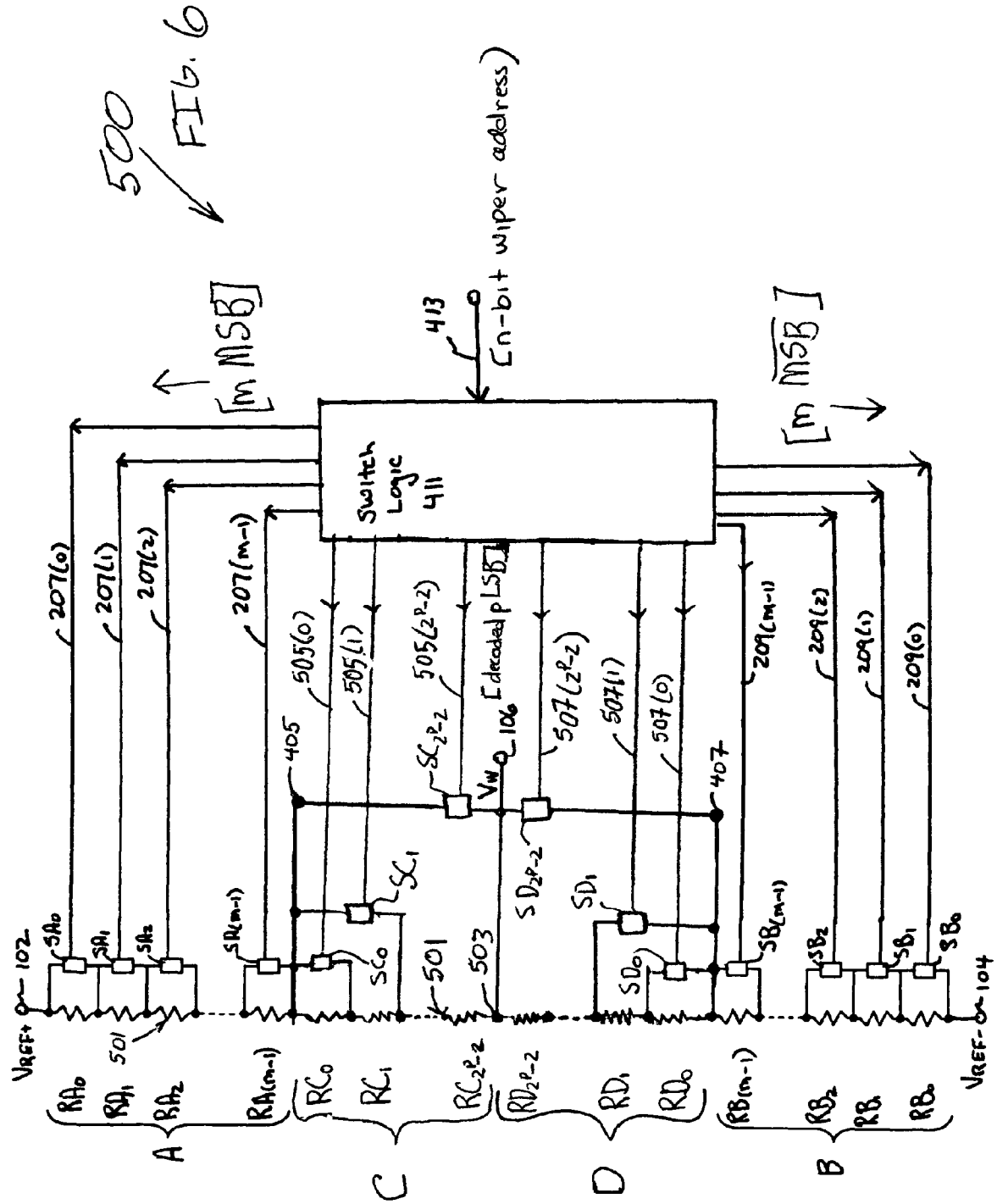
FIG. 6 is a schematic diagram of a digital potentiometer in accordance with a fourth embodiment of the present invention.

FIG. 6 is alternative embodiment of a digital potentiometer in accordance with the present invention. The digital potentiometer 500 of FIG. 6 is similar to digital potentiometer 400 of FIG. 4, and has many of the same components.

For instance, like digital potentiometer 400, digital potentiometer 500 includes a string 501 of resistors in series between a high reference voltage $V_{REF+}$ terminal 104 and low reference voltage $V_{REF-}$ terminal 104, including a first set A of m resistors $RA_0$–$RA_{(m-1)}$, and a second set of m resistors $RB_0$–$RB_{(m-1)}$. The number m is a variable where n≧3>m≧2. Like digital potentiometer 400, digital potentiometer 500 includes a first set of m shunt switches $SA_0$–$SA_{(m-1)}$ and a second set of m shunt switches $SB_0$–$SB_{(m-1)}$, each of which is coupled in parallel with a respective one of the resistors $RA_0$–$RA_{(m-1)}$ and $RB_0$–$RB_{(m-1)}$, respectively. Finally, as in digital potentiometer 400, the switch logic circuit 411 of digital potentiometer 500 provides the m MSB's of the n-bit wiper address to the switches $SA_0$–$SA_{m-1}$, and provides the complements of the m MSB's to the switches $SB_0$–$SB_{m-1}$, respectively. Accordingly, much of the previous discussion applies.

Differences between digital potentiometer 500 and digital potentiometer 400 include that the $2^p-1$ second stage resistors $RC_0$–$RC_{2^p-2}$ and the associated $2^p$ tap switches $SC_0$–$SC_{2^p-1}$ of digital potentiometer 400 are replaced by two sets of $2^p-1$ in-series resistors $RC_0$–$RC_{2^p-2}$ and $RD_0$–$RD_{2^p-2}$ and two sets of $2^p{}_{-1}$ shunt switches $SC_0$–$SC_{2^p-2}$ and $SD_0$–$SD_{2^p-2}$ in digital potentiometer 500. As above, n≧3>m≧2, and p=(n−m)≧1.

In particular, the string 501 of digital potentiometer 500 includes four sets A, B, C, and D of resistors, all of which are in series between terminals 102 and 104. The first and second sets A and B are the same as in digital potentiometer 400. The third set C of $2^p-1$ resistors $RC_0$–$RC_{2^p-2}$ is coupled between nodes 405 and 503 of string 501. The fourth set D of $2^p-1$ resistors $RD_0$–$RD_{2^p-2}$ are coupled between nodes 407 and 503 of string 501. The first resistor $RC_0$ of third set C is coupled to the last resistor $RA_{m-1}$ of first set A and to a terminal of the switch $SA_{m-1}$ at node 405. The last resistor $RC_{2^p-2}$ of third set C is coupled to the last resistor $RD_{2^p-2}$ of fourth set D and to terminals of the switches $SC_{2^p-2}$ and $SD_{2^p-2}$ at node 503, which is between third set C and fourth set D. The output terminal 106 also is coupled to node 503. The first resistor $RD_0$ of fourth set D is coupled to the last resistor $RB_{m-}$ of second set B and to a terminal of the switch $SB_{m-1}$ at node 407.

Each of the resistors $RC_0$–$RC_{2^p-2}$ and $RD_0$–$RD_{2^p-2}$ of string 501 of digital potentiometer 500 has an identical individual resistance of $R_0/(2^p-1)$.

The switches $SC_0$–$SC_{2^p-2}$ are each coupled to the ends of one or two of the resistors of third set C of string 501. In particular, each of the switches $SC_0$–$SC_{2^p-2}$ has a first terminal coupled to node 405, and a second terminal coupled to another one of the nodes of string 501, so that each switch $SC_0$–$SC_{2^p-2}$ is coupled in parallel with at least one of the resistors of third set C. Each of the switches $SC_0$–$SC_{2^p-2}$ is operable to bypass and not bypass any of the resistors $RC_0$–$RC_{2^p-2}$ and any of the switches $SC_0$–$SC_{2^p-3}$ that are between the two terminals of the respective switch, i.e., between node 405 and the respective node of string 501 to which the second terminal of the respective switch is coupled. For example, the first switch $SC_0$ has its second terminal coupled a node formed by the joined ends of the first and second resistors $RC_0$ and $RC_1$ of third set C, and is operable to bypass and not bypass the first resistor $RC_0$. The second switch $SC_1$ has its second terminal coupled a node formed by the joined ends of the second and third resistors $RC_1$ and $RC_2$ of third set C, and is operable to bypass and not bypass the first and second resistors $RC_0$ and $RC_1$ and the first switch $SC_0$. The next-to-last switch $SC_{2^p-3}$ (not shown) has its second terminal coupled a node formed by the joined ends of the next-to-last and last resistors $RC_{2^p-3}$ (not shown) and $RC_{2^p-2}$ of third set C, and is operable to bypass resistors $RC_0$–$RC_{2^p-3}$ and switches $SC_0$–$SC_{2^p-4}$ (not shown). Finally, the last switch $SC_{2^p-2}$ has its second terminal coupled to an end of the last resistor $RC_{2^p-2}$ of third set C at node 503, and is operable to bypass all of the resistors $RC_0$–$RC_{2^p-2}$ of third set C of string 501 and switches $SC_0$–$SC_{2^p-3}$ (not shown).

The fourth set of switches $SD_0$–$SD_{2^p-2}$ is coupled to the resistors of fourth set D of string 501. Each of the switches $SD_0$–$SD_{2^p-2}$ has a first terminal coupled to node 407, and a second terminal coupled to another one of the nodes of string 501, so that each switch $SC_0$–$SC_{2^p-2}$ is coupled in parallel with at least one of the resistors of fourth set D. Each of the switches $SD_0$–$SD_{2^p-2}$ is operable to bypass and not bypass any of the resistors $RD_0$–$RD_{2^p-2}$ and any of the switches $SD_0$–$SD_{2^p-3}$ that are between the two terminals of the respective switch, i.e., between node 407 and the respective node of string 501 to which the second terminal of the respective switch is coupled. For example, the first switch $SD_0$ has its second terminal coupled a node formed by the joined ends of the first and second resistors $RD_0$ and $RD_1$ of fourth set D, and is operable to bypass and not bypass the first resistor $RD_0$. The second switch $SD_1$ has its second terminal coupled a node formed by the joined ends of the second and third resistors $RD_1$ and $RD_2$ of fourth set D, and is operable to bypass and not bypass the first and second resistors $RD_0$ and $RD_1$ and the first switch $SD_0$. The next-to-last switch $SD_{2^P-3}$ (not shown) has its second terminal coupled a node formed by the joined ends of the next-to-last and last resistors $RD_{2^P-3}$ (not shown) and $RD_{2^P-2}$ of fourth set D, and is operable to bypass resistors $RD_0-RD_{2^P-3}$ and switches $SD_0-SD_{2^P-4}$ (not shown). Finally, the last switch $SD_{2^P-2}$ has its second terminal coupled to an end of the last resistor $RD_{2^P-2}$ of fourth set D at node 503, and is operable to bypass all of the resistors $RD_0-RD_{2^P-2}$ of fourth set D of string 501 and switches $SD_0-SD_{2^P-3}$ (not shown).

Each of the switches $SC_0-SC_{2^P-2}$ and $SD_0-SD_{2^P-2}$ has a control terminal coupled to switch logic circuit 411. Switch logic circuit 411 provides each of the switches $SC_0-SC_{2^P-2}$ and $SD_0-SD_{2^P-2}$ with a respective one of a plurality of logical control signals, which causes the respective switch to be open or closed.

In particular, each of the switches $SC_0-SC_{2^P-2}$ has a control terminal coupled to switch logic circuit 411 by a respective one of $2^P-1$ control lines 505(0)–505($2^P-2$), over which the respective switch receives a respective one of $2^P-1$ logical control signals $CC_0-CC_{2^P-2}$. The respective control signals $CC_0-CC_{2^P-2}$ cause the respective recipient switch to be open or closed. Switch logic circuit 411 decodes the p LSB's of the n-bit wiper address to produce the logical control signals $CC_0-CC_{2^P-2}$.

Likewise, each of the switches $SD_0-SD_{2^P-2}$ has a control terminal coupled to switch logic circuit 411 by a respective one of $2^P-1$ control lines 507(0)–507($2^P-2$), over which the respective switch receives a respective one of $2^P-1$ logical control signals $D_0-D_{2^P-2}$. Each of the control signals $DD_0-DD_{2^P-2}$ is a complement of a different one of the logical control signals $CC_0-CC_{2^P-2}$, and causes the respective recipient switch to be open or closed. In particular, each of the control signals $DD_0-DD_{2^P-2}$ is a compliment of the inverse-counting control signal $CC_{2^P-2}-CC_0$. That is, the control signal $DD_0$ provided to the switch $SD_0$ is a complement of the control signal $CC_{2^P-2}$ provided to the switch $SC_{2^P-2}$, the control signal $DD_1$ provided to the switch $SD_1$ is a complement of the control signal $CC_{2^P-3}$ provided to the switch $SC_{2^P-3}$ (not shown), and so on. Finally, the control signal $DD_{2^P-2}$ provided to the switch $SD_{2^P-2}$ is a compliment of the control signal $CC_0$ provided to the switch $SC_0$.

Because of the configuration of the switches $SC_0-SC_{2^P-2}$ and $SD_0-SD_{2^P-2}$, at least some of the switches $SC_0-SC_{2^P-2}$ and $SD_0-SD_{2^P-2}$ will be bypassed in response to any given n-bit wiper address. The control signal provided to a bypassed switch is irrelevant, i.e., has a "don't care" state. The switches $SC_0-SC_{2^P-2}$ and $SD_0-SD_{2^P-2}$ may be implemented as one or two MOSFET transistors, as discussed above.

Switch logic circuit 411 has $2^P$ output states with respect to the decoding of the p LSB's of the n-bit wiper address. Switch logic circuit 411 outputs $2^P-1$ pairs of complementary control signals to the switches $SC_0-SC_{2^P-2}$ and $SD_0-SD_{2^P-2}$. The switches $SC_0-SC_{2^P-2}$ and $SD_0-SD_{2^P-2}$ are operated so that a constant resistance of $R_0$ is maintained between nodes 405 and 407 of string 501. This may be accomplished by bypassing half of the of the combined number of resistors of third set C and fourth set D, and not bypassing the other half of the resistors, in response to any given n-bit wiper address.

The resistance above and below the node 503 of string 501, to which output terminal 106 is coupled, is varied bypassing and not bypassing inverse ones of the resistors $RC_0-RC_{2^P-2}$ and $RD_0-RD_{2^P-2}$. For instance, when the first resistor $RC_0$ of third set C is bypassed (is not bypassed), then the last resistor $RD_{2^P-2}$ of fourth set D is not bypassed (is bypassed). When the first and second resistors $RC_0$ and $RC_1$ of third set C are bypassed (are not bypassed), then the next-to-last and last resistors $RD_{2^P-3}$ (not shown) and $RD_{2^P-2}$ of fourth set D are not bypassed (are bypassed), and so on. Finally, when all of the resistors $RC_0-RC_{2^P-2}$ of third set C are bypassed (or not bypassed), then all of the resistors $RD_0-RD_{2^P-2}$ of fourth set D are not bypassed (or are bypassed). To facilitate our reader's understanding of digital potentiometer 500, the following example is provided.

EXAMPLE 6

Similar to Example 3, assume that digital potentiometer 500 of FIG. 6 has an eight bit (i.e., n=8) wiper address, and accordingly has $2^8$, i.e., 256, wiper positions. Further assume that m=5, so that p=3, i.e., n-m=3. In such a case, string 501 will include a total of 24 resistors in series, with five resistors $RA_0-RA_4$ in first set A, five resistors $RB_0-RB_4$ in second set B, seven resistors $RC_0-RC_6$ in third set C, and seven resistors $RD_0-RD_6$ in fourth set D. The sequential resistors $RA_0-RA_4$ and $RB_0-RB_4$ will have values of $2^0*R_0$, $2^1*R_0$, $2^2*R_0$, $2^3*R_0$, and $2^4*R_0$, i.e., $R_0$, $2R_0$, $4R_0$, $8R_0$, and $16R_0$, respectively. Moreover, each of the seven resistors $RC_0-RC_6$ and $RD_0-RD_6$ will have a value of $R_0/(2^P-1)$ i.e., $R_0/7$.

In addition, the digital potentiometer 500 will have 24 switches, including five switches $SA_0-SA_4$, five switches $SB_0-SB_4$, seven switches $SC_0-SC_6$, and seven switches $SD_0-SD_6$. In operation, the switch logic circuit 411 will use the five MSB's of the 8-bit wiper address to operate switches $SA_0-SA_4$, will use the complements of the five MSB's to operate switches $SB_0-SB_4$, and will decode the three LSB's of the 8-bit wiper address to operate the 14 switches $SC_0-SC_6$ and $SD_0-SD_6$.

Now assume that the digital potentiometer 500 receives an eight-bit wiper address of 00000000, which corresponds to the first wiper position, i.e., $V_w=V_{REF-}$. In response, switch logic circuit 411 will output 24 controls signals $C_0-C_4$, $/C_0-/C_4$, $CC_0-CC_6$, and $DD-DD_6$, to the switches $SA_0-SA_4$, $SB_0-SB_4$, $SC_0-SC_6$, and $SD_0-SD_6$, respectively, that will cause the recipient ones of the switches to be either open or closed. As mentioned, the five control signals $C_0-C_4$ correspond to the m MSB's of the n-bit wiper address, the five control signals $/C_0-/C_4$ are complements of the m MSB's, and the 14 control signals $CC_0-CC_6$ and $DD_0-DD_6$ include seven pairs of complementary bits and reflect a decoding of the p LSB's of the n-bit wiper address. The control signals $DD_0-DD_6$ are complements of control signals $CC_6-CC_0$, respectively.

As a result, digital potentiometer 500 will move to a configuration be such that: (1) the switches $SA_0-SA_4$ will be open, so that the resistors $RA_0-RA_4$ are not bypassed; (2) the switches $SC_0-SC_6$ will be open, so that the resistors $SC_0-SC_6$ of third set C are not bypassed; (3) the switches $SD_0-SD_6$ will be closed, or at least switch $SD_6$ will be closed, so that all of the resistors $SD_0-SD_6$ of fourth set D are bypassed; and (4) the switches $SB_0-SB_4$ will be closed, so that the resistors $RB_0-RB_4$ are bypassed. Accordingly, the entire $255*R_0$ resistance of string 501 will be between node 503 (i.e., the wiper) and terminal 102. Accordingly, $V_w=V_{REF-}$.

Now assume that the digital potentiometer 500 receives a n-bit wiper address of 00110010, which corresponds to the 50th wiper position of the 256 wiper positions of digital potentiometer 400. The three (i.e., p) LSB's are 010, and the five (i.e., m) MSB's are 00110. In response, switch logic circuit 411 will output 24 controls signals $C_0$–$C_4$, /$C_0$–/$C_4$, $CC_0$–$CC_6$, and $DD$–$DD_6$, to the switches $SA_0$–$SA_4$, $SB_0$–$SB_4$, $SC_0$–$SC_6$, and $SD_0$–$SD_6$, respectively, that will cause the recipient ones of the switches to be either open or closed. As a result, the digital potentiometer 500 will move to a configuration such that: (1) the switches $SA_0$, $SA_3$, and $SA_4$ will be open, so that the resistors $RA_0$, $RA_3$, and $RA_4$ will not be bypassed; (2) the switches $SA_1$ and $SA_2$ will be closed, so that the resistors $RA_1$ and $RA_2$ will be bypassed; (3) switches $SC_0$ and $SC_1$ will be closed, or at least switch $SC_1$ will be closed, so that the resistors $RC_0$ and $RC_1$ are bypassed; (4) the switches $SC_2$–$SC_6$ will be open, so that resistors $RC_2$–$RC_6$ will not be bypassed; (5) switches $SD_5$ and $SD_6$ will be open, so that the resistors $RD_5$ and $RD_6$ are not bypassed; (6) the switches $SD_0$–$SD_4$ will be closed, or at least switch $SD_4$ will be closed, so that resistors $RD_0$–$RD_4$ will be bypassed; (6) the switches $SB_0$, $SB_3$, and $SB_4$ will be closed, so that the resistors $RB_0$, $RB_3$, and $RB_4$ will be bypassed; and (7) the switches $SB_1$ and $SB_2$ will be open, so that the resistors $RB_1$ and $RB_2$ will not be bypassed. Accordingly, the resistance between node 503 (i.e., the wiper) and terminal 104 will be $R_0*(6+2/7)$ i.e., the sum of the resistances of $RB_1$, $RB_2$, $RD_5$, and $RD_6$, and the resistance between node 503 and terminal 102 will be $R_0*(25+5/7)$, i.e., the sum of the resistances of resistors $RA_0$, $RA_3$, $RA_4$, and $RC_2$–$RC_6$.

Finally, assume that the digital potentiometer 500 receives an eight-bit wiper address of 11111111, corresponding to the last wiper position, i.e., $V_w=V_{REF+}$. In response, switch logic circuit 411 will output 24 controls signals $C_0$–$C_4$, /$C_0$–/$C_4$, $CC_0$–$CC_6$, and $DD$–$DD_6$, to the switches $SA_0$–$SA_4$, $SB_0$–$SB_4$, $SC_0$–$SC_6$, and $SD_0$–$SD_6$, respectively, that will cause the recipient ones of the switches to be either open or closed. As a result, digital potentiometer 500 will move to a configuration be such that: (1) the switches $SA_0$–$SA_4$ will be closed, so that the resistors $RA_0$–$RA_4$ are bypassed; (2) the switches $SC_0$–$SC_6$ will be closed, or at least switch $SC_6$ will be closed, so that all of the resistors $SC_0$–$SC_6$ of third set C are bypassed; (3) the switches $SD_0$–$SD_6$ will be open, so that the resistors $SD_0$–$SD_6$ of fourth set D are not bypassed; and (4) the switches $SB_0$–$SB_4$ will be open, so that the resistors $RB_0$–$RB_4$ are not bypassed. Accordingly, the entire resistance of string 501 will be between node 503 (i.e., the wiper) and terminal 104. Accordingly, $V_w=V_{REF+}$.

In view of the foregoing, the eight-bit digital potentiometer 500 of Example 6 allows for the same number of wiper addresses (i.e., 256) as the conventional digital potentiometer 100 of FIG. 1, yet accomplishes this result with significantly fewer resistors and switches. In particular, the eight-bit digital potentiometer 500 of Example 6 has 24 resistors and 24 switches, whereas an eight-bit digital potentiometer 100 has 255 resistors and 256 switches. The number of resistors and switches of digital potentiometer 500 can be optimized by varying the number m.

The digital potentiometer 500 of FIG. 6 has a greater number of resistors and switches than digital potentiometer 400 of FIG. 4, because the shunt configuration of the second stage of digital potentiometer 500 requires twice as many resistors and switches as the tapping configuration of the second stage of digital potentiometer 400. Depending on the application, however, this may be acceptable because digital potentiometer 500 will have a different electrical performance than digital potentiometer 400. For instance, the on-resistance and substrate bias of the second stage switches $SC_0$–$SC_{2p-2}$ and $SD_0$–$SD_{2p-2}$ of digital potentiometer 500 is constant across all of the switches, whereas the on-resistance and substrate bias of the second stage switches $SC_0$–$SC_{2p-2}$ of digital potentiometer 400 vary across the switches $SC_0$–$SC_{2}{}^{p}{}_{-2}$ depending on where each of the switches is coupled to string 401.

Depending on the application, it may be appropriate to add two second stage resistors (one between resistor $RC_0$ and resistor $RA_{(m-1)}$ and one between resistor $RD_0$ and resistor $RB_{(m-1)}$) and two always-on dummy switches, with each of the dummy switches being in parallel with a respective one of the two additional resistors, to digital potentiometer 500 to enhance the linearity of the digital potentiometer 500, as is described in a commonly-assigned U.S. patent application Ser. No. 10/660,232, filed on Sep. 10, 2003, which is incorporated herein by reference in its entirety.

Figure 7:
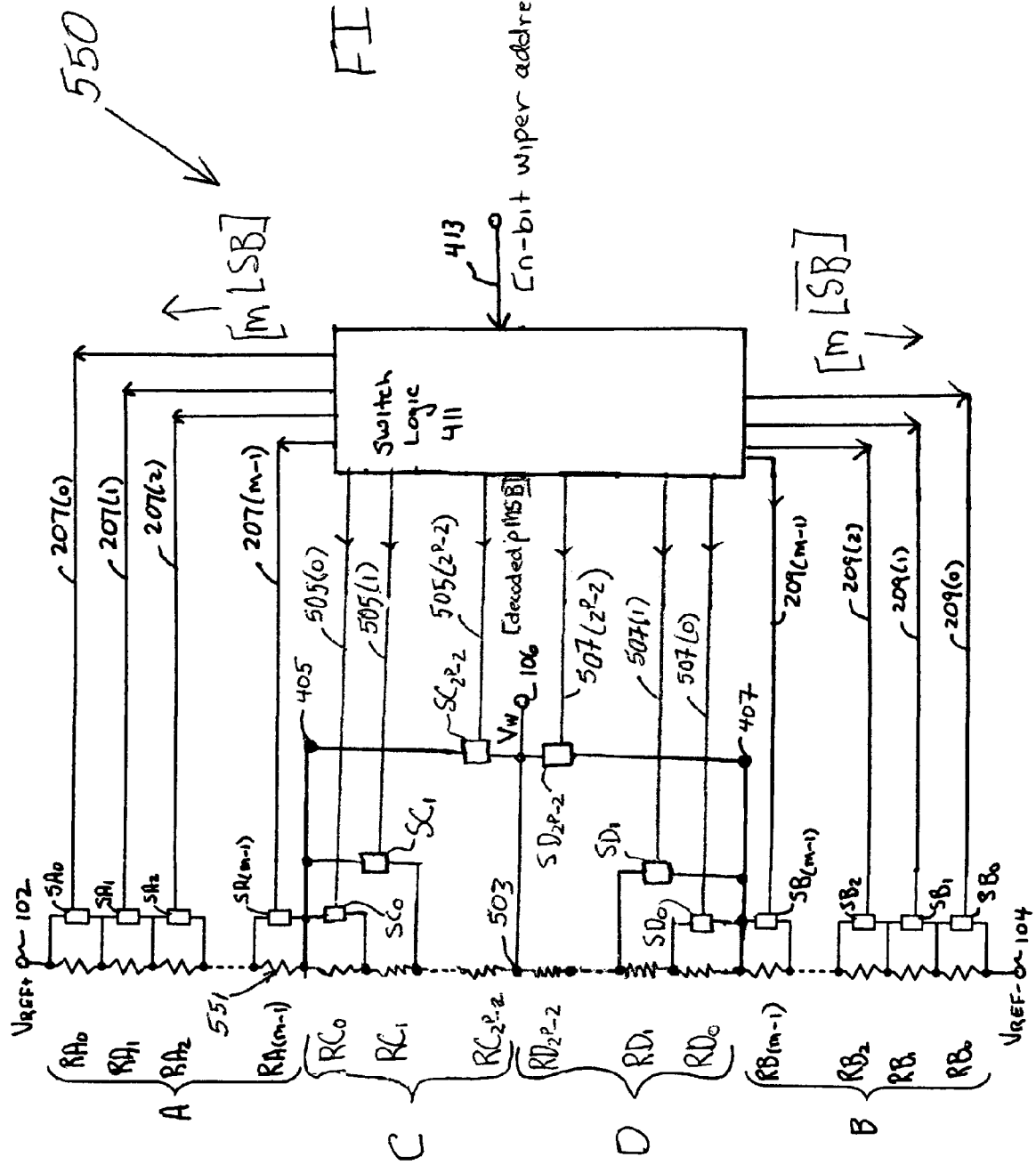
FIG. 7 is a schematic diagram of a digital potentiometer in accordance with a fifth embodiment of the present invention.

FIG. 7 is alternative embodiment of a digital potentiometer in accordance with the present invention. The digital potentiometer 550 of FIG. 7 is similar to digital potentiometer 500 of FIG. 6, and has many of the same components. For the sake of brevity, our discussion will focus on the two primary differences between digital potentiometers 500 and 550.

First, with respect to the $2^p-1$ resistors $RC_0$–$RC_2{}^{p}{}_{-2}$ in of third set C and the $2^p-1$ resistors $RD_0$–$RD_2{}^{p}{}_{-2}$ in of fourth set D of string 551 of digital potentiometer 550, each resistor $RC_0$–$RC_2{}^{p}{}_{-2}$ and $RD_0$–$RD_2{}^{p}{}_{-2}$ has an identical resistance of $R_0*2^m$. That is, each of the resistors $RC_0$–$RC_2{}^{p}{}_{-2}$ and $RD_0$–$RD_2{}^{p}{}_{-2}$ has a resistance value equal to the incremental resistance $R_0$ plus either the combined resistance of all of the resistors $RA_0$–$RA_{(m-1)}$ of first set A or the combined resistance of all of the resistors $RB_0$–$RB_{m-1}$ of second set B. (As noted, the overall resistance first set A and second set B are equal.). By contrast, in digital potentiometer 500, each resistor $RC_0$–$RC_2{}^{p}{}_{-2}$ and $RD_0$–$RD_2{}^{p}{}_{-2}$ has an identical resistance of $R_0/(2^p-1)$.

Second, the control signals $C_0$–$C_{(m-1)}$, which are provided to the switches $SA_0$–$SA_{(m-1)}$ of digital potentiometer 550 respectively correspond to the m LSB's of the n-bit wiper address provided to switch logic circuit 411 via line 413. Similarly, the m logical control signals /$C_0$–/$C_{(m-1)}$ that are provided to the switches $SB_0$–$SB_{(m-1)}$ respectively by switch logic circuit 411 are complements of the m LSB's of the n-bit wiper address. In addition, the logical control signals $CC_0$–$CC_2{}^{p}{}_{-2}$ that are provided to shunt switches $SC_0$–$SC_2{}^{p}{}_{-2}$, respectively, by switch logic circuit 411 are produced by switch logic circuit 411 through a decoding of the p MSB's of the n-bit wiper address. Finally, each of the control signals $DD_0$–$DD_2{}^{p}{}_{-2}$, which are respectively provided to shunt switches $SD_0$–$SD_2{}^{p}{}_{-2}$, is a compliment of the inverse-counting control signal $CC_2{}^{p}{}_{-2}$–$CC_0$, respectively. By contrast, in digital potentiometer 500, the control signals $C_0$–$C_{(m-1)}$ correspond to the m MSB's of the n-bit wiper address, the control signals /$C_0$–/$C_{(m-1)}$ are complements thereof, and the control signals $CC_0$–$CC_2{}^{p}{}_{-1}$ are decoded from the p LSB's of the n-bit wiper address.

Accordingly, the differences between digital potentiometers 500 and 550 are similar to the differences between digital potentiometers 400 and 450.

To facilitate our reader's understanding of digital potentiometer 550, the following examples are provided.

EXAMPLE 7

Similar to Example 6, assume that digital potentiometer 550 has an eight bit (i.e., n=8) wiper address, and accordingly has $2^8$, i.e., 256, wiper positions. Further assume that m=5, so that p=3, i.e., n−m=3. In such a case, string 551 will include a total of 24 resistors in series, with five resistors $RA_0$–$RA_4$ in first set A, five resistors $RB_0$–$RB_4$ in second set B, seven resistors $RC_0$–$RC_6$ in third set C, and seven resistors $RD_0$–$RD_6$ in fourth set D. The sequential resistors $RA_0$–$RA_4$ and $RB_0$–$RB_4$ will have values of $2^0 \ast R_0$, $2^1 \ast R_0$, $2^2 \ast R_0$, $2^3 \ast R_0$, and $2^4 \ast R_0$, i.e., $R_0$, $2R_0$, $4R_0$, $8R_0$, and $16R_0$, respectively. Moreover, each of the seven resistors $RC_0$–$RC_6$ and $RD_0$–$RD_6$ will have a value of $2^5 \ast R_0$, i.e., $32R_0$, which is one resistance unit $R_0$ greater than the combined resistance of the first set A or second set B of string 551.

In addition, the digital potentiometer 550 will have 24 switches, including five switches $SA_0$–$SA_4$, five switches $SB_0$–$SB_4$, seven switches $SC_0$–$SC_6$, and seven switches $SD_0$–$SD_6$. In operation, the switch logic circuit 411 will use the five LSB's of the 8-bit wiper address to operate switches $SA_0$–$SA_4$, will use the complements of the five LSB's to operate switches $SB_0$–$SB_4$, and will decode the three MSB's of the 8-bit wiper address to operate the 14 switches $SC_0$–$SC_6$ and $SD_0$–$SD_6$.

With respect to the first and last wiper positions, i.e., corresponding to n-bit wiper addresses of 00000000 and 11111111, respectively, digital potentiometer 550 of Example 7 has the same configurations as digital potentiometer 500 of Example 6.

Now assume that the digital potentiometer 550 receives a n-bit wiper address of 00110010, which corresponds to the $50^{th}$ wiper position of the 256 wiper positions of digital potentiometer 400. In response, switch logic circuit 411 will output 24 controls signals $C_0$–$C_4$, /$C_0$–/$C_4$, $CC_0$–$CC_6$, and $DD_0$–$DD_6$, to the switches $SA_0$–$SA_4$, $SB_0$–$SB_4$, $SC_0$–$SC_6$, and $SD_0$–$SD_6$, respectively, that will cause the recipient ones of the switches to be either open or closed. As a result, the digital potentiometer 550 will move to a configuration such that: (1) the switches $SA_0$, $SA_2$, and $SA_3$ will be open, so that the resistors $RA_0$, $RA_2$, and $RA_3$ will not be bypassed; (2) the switches $SA_1$ and $SA_4$ will be closed, so that the resistors $RA_1$ and $RA_4$ will be bypassed; (3) switch $SC_0$ will be closed, so that the resistor $SC_0$ is bypassed; (4) the switches $SC_1$–$SC_6$ will be open, so that resistors $RC_1$–$RC_6$ will not be bypassed; (5) switch $SD_6$ will be open, so that the resistor $SD_6$ is not bypassed; (6) the switches $SD_0$–$SD_5$ will be closed, so that resistors $RD_0$–$RD_5$ will be bypassed; (6) the switches $SB_0$, $SB_2$, and $SB_3$ will be closed, so that the resistors $RB_0$, $RB_2$, and $RB_3$ will be bypassed; and (7) the switches $SB_1$ and $SB_4$ will be open, so that the resistors $RB_1$ and $RB_4$ will not be bypassed. Accordingly, the resistance between node 503 (i.e., the wiper) and terminal 104 will be $50 \ast R_0$, i.e., the sum of the resistances of $RB_1$, $RB_4$, and $RD_0$, and the resistance between node 503 and terminal 102 will be $205 \ast R_0$, i.e., the sum of the resistances of resistors $RA_0$, $RA_2$, $RA_3$, and $RC_1$–$RC_6$.

The above-described embodiments are merely illustrative and not limiting. Various changes and modifications may be made to the exemplary embodiments herein without departing from the invention in its broader aspects.

We claim:

1. An integrated circuit, comprising:
  a first set of at least two impedance units coupled in series between a first end and a second end thereof, wherein each of the impedance units has a different individual impedance value, and the individual impedance values increment across the set according to the formula $I_0 \ast 2^X$, where $I_0$ is a selected base impedance value and X is a series of successive integers beginning with and including zero;
  a second set of at least two impedance units coupled in series between a first end and a second end thereof, wherein the first and second sets of impedance units are in series and have a same number of impedance units and a same overall impedance, and each impedance unit of the second set has an individual impedance value equal to the individual impedance value of a corresponding one of the impedance units of the first set.

2. The integrated circuit of claim 1, wherein the first and second sets of impedance units each extend in order of incrementing impedance from the first end of the respective set to the second end of the respective set.

3. The integrated circuit of claim 1, wherein the first and second sets of impedance units are mirror images of each other.

4. The integrated circuit of claim 1, wherein one of the first and second ends of the first set is coupled to one of the first and second ends of the second set at a central node.

5. The integrated circuit of claim 4, wherein the first and second sets of impedance units are mirror images of each other with respect to the central node.

6. The integrated circuit of claim 1, wherein the first set of impedance units extends in order of incrementing impedance from the first end of the first set to the second end of the first set, the second set of impedance units extends in order of incrementing impedance from the first end of the second set to the second end of the second set, and the second end of the first set is coupled to the second end of the second set.

7. The integrated circuit of claim 1, further comprising:
  a first set of switches, wherein each of the switches is coupled in parallel with a respective one of the impedance units of the first set of impedance units, with each switch being operable to bypass and not bypass the respective one of the impedance units with which the switch is coupled in parallel; and
  a second set of switches, wherein each of the switches is coupled in parallel with a respective one of the impedance units of the second set of impedance units, with each switch being operable to bypass and not bypass the respective one of the impedance units with which the switch is coupled in parallel.

8. The integrated circuit of claim 7, wherein one of the first and second ends of the first set is coupled to one of the first and second ends of the second set at a central node.

9. The integrated circuit of claim 8, wherein the first and second sets of impedance units are mirror images of each other with respect to the central node.

10. The integrated circuit of claim 8, wherein each of the switches of the first set of switches is coupled to receive a respective one of a first set of logical control signals, and each of the switches of the second set of switches is coupled to receive a respective one of a second set of logical control signals, the second set of logical control signals being complementary to the first set of logical control signals.

11. The integrated circuit of claim 8, wherein the switches of the first and second sets that are coupled to the identical impedance value impedance units are coupled receive complementary logical control signals.

12. The integrated circuit of claim 7, wherein each of the switches of the first set of switches is coupled to receive a respective one of a first set of logical control signals, and each of the switches of the second set of switches is coupled to receive a respective one of a second set of logical control signals, the second set of logical control signals being complementary to the first set of logical control signals.

13. The integrated circuit of claim 7, wherein the switches of the first and second sets that are coupled to the identical impedance value impedance units are coupled receive complementary logical control signals.

14. The integrated circuit of claim 1, further comprising at least one third impedance unit, wherein each said at least one third impedance unit is in series with the first and second sets of impedance units.

15. The integrated circuit of claim 14, wherein the at least one third impedance unit has an impedance value equal to $I_0$ plus the combined impedance value of the first set of impedance units.

16. The integrated circuit of claim 15, wherein the at least one third impedance unit is coupled between the first set of impedance units and the second set of impedance units, and the first and second sets of impedance units are mirror images of each other with respect to the at least one third impedance unit.

17. The integrated circuit of claim 14, further comprising a plurality of third switches each having a first terminal and a second terminal,
wherein for each said at least one third impedance unit, the first terminal of a respective one of the third switches has its first terminal coupled to a first end of the third impedance unit, and another one of the third switches has its first terminal coupled to a second end of the third impedance unit, with each of the second terminals of the third switches being coupled to a common node.

18. The integrated circuit of claim 17, wherein there are a plurality of the third impedance units coupled between the first and second sets of impedance units, and each of the third impedance units has an impedance value equal to $I_0$ plus the combined impedance value of the first set of impedance units.

19. The integrated circuit of claim 18, wherein each of the third switches is coupled to receive a respective one of a third set of logical control signals from a decoder circuit.

20. The integrated circuit of claim 14, wherein there are a plurality of pairs of the third impedance units, each having an identical impedance value, with one of the impedance units of each said pair is between the first set of at least two impedance units and a central node of a string including the first and second sets of at least two impedance units and the third impedance units, and the other impedance unit of the respective pair is between the central node and the second set of at least two impedance units.

21. The integrated circuit of claim 20, further comprising a plurality of pairs of third switches, wherein each of the third switches has first and second terminals, with the first and second terminals each being coupled to an end of at least two of the third resistors.

22. An integrated circuit comprising:
a string of at least four impedance units coupled in series, wherein the at least four impedance units have different individual impedance values, the individual impedance values incrementing according to the formula $I_0*2^X$, where $I_0$ is a selected base impedance value and X is a series of successive integers beginning with and including 0; and
a plurality of switches, wherein a respective one of the switches is coupled in parallel with each respective one of the impedance units.

23. The integrated circuit of claim 22, wherein the string includes a plurality of pairs of the impedance units, wherein the two impedance units of each of the pairs have an identical individual impedance value, and the individual impedance values increment across all of the pairs according to the formula $I_0*2^X$, where $I_0$ is a selected base impedance value and X is different one of a series of successive integers beginning with and including zero.

24. The integrated circuit of claim 23, wherein the string includes a first set of the impedance units and a second set of the impedance units, wherein one of the impedance units of each of the pairs is in the first set, and the other impedance unit of each of the pairs is in the second set, the first and second sets being connected at a central node of the string.

25. The integrated circuit of claim 22, wherein the string includes at least one third impedance unit having an impedance value different than the individual impedance value of any of the at least four impedance units.

26. The integrated circuit of claim 23, wherein the string includes a first set of the impedance units and a second set of the impedance units, wherein one of the impedance units of each of the pairs is in the first set, and the other impedance unit of each of the pairs is in the second set, and
wherein the string further includes at least one third impedance unit, and each said at least one third impedance unit has an identical impedance value, the impedance value being selected from the group consisting of: (a) $I_0$ plus the combined impedance of the first set of impedance units; and (b) $I_0$ divided by $2^y-1$, where y is the number of impedance units of the first set.

27. The integrated circuit of claim 26, further comprising:
a plurality of third switches, wherein for each at least one third impedance unit, a first terminal of a respective one of the third switches is coupled to a first end of the respective third impedance unit, and a first terminal of another respective one of the third switches is coupled to a second end of the respective third impedance unit, and a second terminal of all of the third switches is coupled to a common node.

28. The integrated circuit of claim 22, wherein the string includes a plurality of pairs of the impedance units, wherein the two impedance units of each of the pairs each have an identical individual impedance value, wherein the respective switches coupled to the respective impedance units of each said pair are coupled to receive complimentary logical control signals.

29. The integrated circuit of claim 28, wherein the individual impedance values increment across all of the pairs according to the formula $I_0*2^X$, where $I_0$ is a selected base impedance value and X is a different one of a series of successive integers beginning with and including zero.

30. The integrated circuit of claim 25, wherein there are a plurality of pairs of the third impedance units in the string, each having an identical impedance value, and further comprising:
a plurality of pairs of second switches, wherein each of the third impedance units is bypassable by at least one of the second switches.

31. A method of operating a digital potentiometer, the method comprising:
providing an n-bit wiper address to a digital potentiometer comprising first and second sets of at least two switches each coupled to a string of at least four impedance units in series, wherein n is at least two and each said switch of the first set corresponds with one said switch of the second set;
using a first bit of the n-bit wiper address to control a first said switch of the first set, and a complement of the first bit to control the corresponding said switch of the second set; and using a second bit of the n-bit wiper address to control a second said switch of the first set, and a complement of the second bit to control the corresponding said switch of the second set, the first and second bits being sequential in the n-bit wiper address.

32. The method of claim 31, wherein each of the bits of the n-bit wiper address is used to control a respective one of the switches of the first set, and the complement of each of the bits of the n-bit wiper address is used to control the corresponding said switch of the second set.

33. The method of claim 31, wherein n is at least three and the digital potentiometer includes a third set of at least two switches coupled to the string, and further comprising:
decoding at least a third bit of the n-bit wiper address to produce a plurality of decoded control signals; and
using each of the decoded control signals to control a respective one of the switches of the third set.

34. The method of claim 33, wherein n is at least four, and the third bit and at least one other bit of the n-bit wiper address are decoded to produce the decoded control signals.

35. The method of claim 31, wherein each said switch of the first and second sets of switches is coupled in parallel with a respective one of the impedance units, and is operable to bypass and not bypass the respective impedance unit.

36. The method of claim 35, wherein the respective impedance units with which the respective switches of the first set are coupled in parallel have different individual impedance values, the individual impedance values incrementing according to the formula $I_0 * 2^X$, where $I_0$ is a selected base impedance and X is a series of successive integers beginning with and including zero, and
wherein said each switch of the second set is coupled in parallel with a said impedance unit having an individual impedance value equal to the individual value of the impedance unit with which the corresponding switch of the first set is coupled in parallel.

37. A method of operating a digital potentiometer, the method comprising: providing an n-bit wiper address to a digital potentiometer comprising a string of in-series impedance units, the string including a plurality of pairs of the impedance units, the two impedance units of each pair having an identical individual impedance value, wherein n is at least two, and, wherein the individual impedance values increment across the pairs according to the formula $I_0 * 2^X$, where $I_0$ is a selected base impedance value and X is different one of a series of successive integers beginning with and including zero; and, for each said pair of impedance units, in response to the n-bit wiper address, bypassing one impedance unit of the pair and not bypassing the other impedance unit of the pair.

38. The method of claim 37, wherein whether one or the other of the two impedance units of each pair is bypassed depends on a state of a respective one of the bits of the n-bit wiper address.

39. A method of operating a digital potentiometer, the method comprising: providing an n-bit wiper address to a digital potentiometer comprising a string of in-series impedance units, the string including a plurality of pairs of the impedance units, the two impedance units of each pair having an identical individual impedance value, wherein n is at least two and, for each said pair of impedance units, in response to the n-bit wiper address, bypassing one impedance unit of the pair and not bypassing the other impedance unit of the pair, wherein whether one or the other of the two impedance units of each pair is bypassed depends on a state of a respective one of the bits of the n-bit wiper address.

40. The method of claim 39, wherein there are n pairs of the impedance units.

41. A method of operating a digital potentiometer, the method comprising: providing an n-bit wiper address to a digital potentiometer comprising a string of in-series impedance units, the string including a plurality of pairs of the impedance units, wherein there are less than n pairs of the impedance units the two impedance units of each pair having an identical individual impedance value, wherein n is at least two and, for each said pair of impedance units, in response to the n-bit wiper address, bypassing one impedance unit of the pair and not bypassing the other impedance unit of the pair.

42. The method of claim 41, wherein n is at least three, the string includes m pairs of the impedance units, m being at least two, and the string further comprises one or more third impedance units, the number of third impedance units being $2^{(n-m)}-1$ and further comprising:
tapping the string at an end of at least one said third impedance unit in response to the n-bit wiper address.

43. The method of claim 41, wherein n is at least three, the string includes m pairs of the impedance units, m being at least two, and the string further comprises a plurality of pairs of third impedance units, the number of third impedance units being $2*(2^{(n-m)}-1)$, and further comprising:
bypassing one of the third impedance units of each said pair of third impedance units, and not bypassing the other third impedance unit of the respective pair of third impedance units in response to the n-bit wiper address.

* * * * *